(12) United States Patent
Yang et al.

(10) Patent No.: US 10,447,900 B2
(45) Date of Patent: Oct. 15, 2019

(54) CAMERA MODULE DESIGN WITH LEAD FRAME AND PLASTIC MOULDING

(71) Applicant: Apple Inc., Cupertino, CA (US)

(72) Inventors: Annabelle Q. Yang, Singapore (SO); Howell John Chua Toc, Singapore (SO); Prakash Venkatesappa, Singapore (SO); Kolan Ravi Kanth, Singapore (SO)

(73) Assignee: Apple Inc., Cupertino, CA (US)

( * ) Notice: Subject to any disclaimer, the term of this patent is extended or adjusted under 35 U.S.C. 154(b) by 98 days.

(21) Appl. No.: 14/820,485

(22) Filed: Aug. 6, 2015

(65) Prior Publication Data

US 2017/0041513 A1 Feb. 9, 2017

(51) Int. Cl.
*H04N 5/225* (2006.01)
*H05K 1/18* (2006.01)

(52) U.S. Cl.
CPC ......... *H04N 5/2252* (2013.01); *H04N 5/2253* (2013.01); *H05K 1/189* (2013.01); *H05K 2201/10121* (2013.01); *H05K 2201/10151* (2013.01); *H05K 2201/2009* (2013.01); *H05K 2203/1316* (2013.01)

(58) Field of Classification Search
CPC .................................................... H04N 5/2257
See application file for complete search history.

(56) References Cited

U.S. PATENT DOCUMENTS

| 6,774,447 B2 | 8/2004 | Kondo et al. |
| 7,714,931 B2 | 5/2010 | Singh et al. |
| 2005/0063033 A1* | 3/2005 | Kinsman ............ H01L 24/97 359/245 |
| 2005/0185088 A1* | 8/2005 | Kale ............ H01L 27/14618 348/374 |
| 2005/0258502 A1 | 11/2005 | Kong et al. |
| 2005/0285973 A1* | 12/2005 | Singh ............ H01L 27/14618 348/374 |
| 2007/0031137 A1 | 2/2007 | Bogdan et al. |
| 2010/0053423 A1* | 3/2010 | Singh .................. G03B 19/00 348/374 |
| 2010/0328525 A1 | 12/2010 | Lee et al. |

(Continued)

FOREIGN PATENT DOCUMENTS

| KR | 20130053178 | 5/2013 | |
| WO | 2015016586 | 2/2015 | |
| WO | WO 2015016586 A1 * | 2/2015 | ............ G03B 3/10 |

OTHER PUBLICATIONS

International Search Report and Written Opinion from PCT/US2016/045861, dated Nov. 8, 2016, Apple Inc., pp. 1-13.

*Primary Examiner* — Twyler L Haskins
*Assistant Examiner* — Dwight Alex C Tejano
(74) *Attorney, Agent, or Firm* — Robert C. Kowert; Meyertons, Hood, Kivlin, Kowert & Goetzel, P.C.

(57) ABSTRACT

A camera module includes an image sensor, a flexible printed circuit with a first side affixed to a first side of the image sensor, a plurality of metallic leads affixed to a second side of the image sensor, and a lens assembly for directing light to the image sensor articulated to the image sensor by one or more of an overmolding attached to the leads and the flexible printed circuit. The first side of the image sensor is a side opposite the second side of the image sensor. The leads provide connection between the image sensor and leads in the flexible printed circuit.

20 Claims, 25 Drawing Sheets

(56) References Cited

U.S. PATENT DOCUMENTS

| | | | |
|---|---|---|---|
| 2011/0102667 A1* | 5/2011 | Chua | H04N 5/2251 |
| | | | 348/374 |
| 2013/0215284 A1* | 8/2013 | Wade | G03B 5/00 |
| | | | 348/208.7 |
| 2014/0048997 A1* | 2/2014 | Cheng | H05K 1/189 |
| | | | 269/303 |
| 2014/0055669 A1 | 2/2014 | Chen | |
| 2014/0098288 A1* | 4/2014 | Singh | G03B 19/00 |
| | | | 348/374 |
| 2016/0165125 A1* | 6/2016 | Kim | G03B 3/10 |
| | | | 348/345 |

* cited by examiner

CAMERA MODULE DESIGN WITH LEAD FRAME AND PLASTIC MOULDING

BACKGROUND

Technical Field

This disclosure relates generally to camera modules and more specifically to camera modules for mobile computing devices.

Description of the Related Art

The advent of small, mobile multipurpose devices such as smartphones and tablet or pad devices has resulted in a need for high-resolution, small form factor cameras for integration in the devices.

For high-end miniature cameras, it is common to incorporate a ceramic substrate with contact leads for contact with the image sensor. Such a substrate adds both to the weight and size of the camera device.

Miniature cameras are typically used in mobile devices such as cellphones and other multifunction devices. In such devices, space is a premium and every effort is made to minimize the camera size and weight.

Demands on improvements to performance of such miniature cameras are constant, as are demands for continued miniaturization, given the added features and devices added to such mobile devices.

Further to this, there is a strong desire, for a given size of camera, to fit bigger lenses and image sensors to improve image quality, and hence there is a desire to reduce the size of structural components. However, some small-sized components, including various structural components, can be relatively complex to assemble and can be vulnerable to failure, based at least in part upon small size and complexity of various components.

SUMMARY OF EMBODIMENTS

Some embodiments include an image sensor, a flexible printed circuit with a first side affixed to a first side of the image sensor, a plurality of metallic leads affixed to a second side of the image sensor, and a lens assembly for directing light to the image sensor articulated to the image sensor by one or more of an overmoulding attached to the leads and the flexible printed circuit. The first side of the image sensor is a side opposite the second side of the image sensor. The leads provide connection between the image sensor and leads in the flexible printed circuit.

Figure 1:
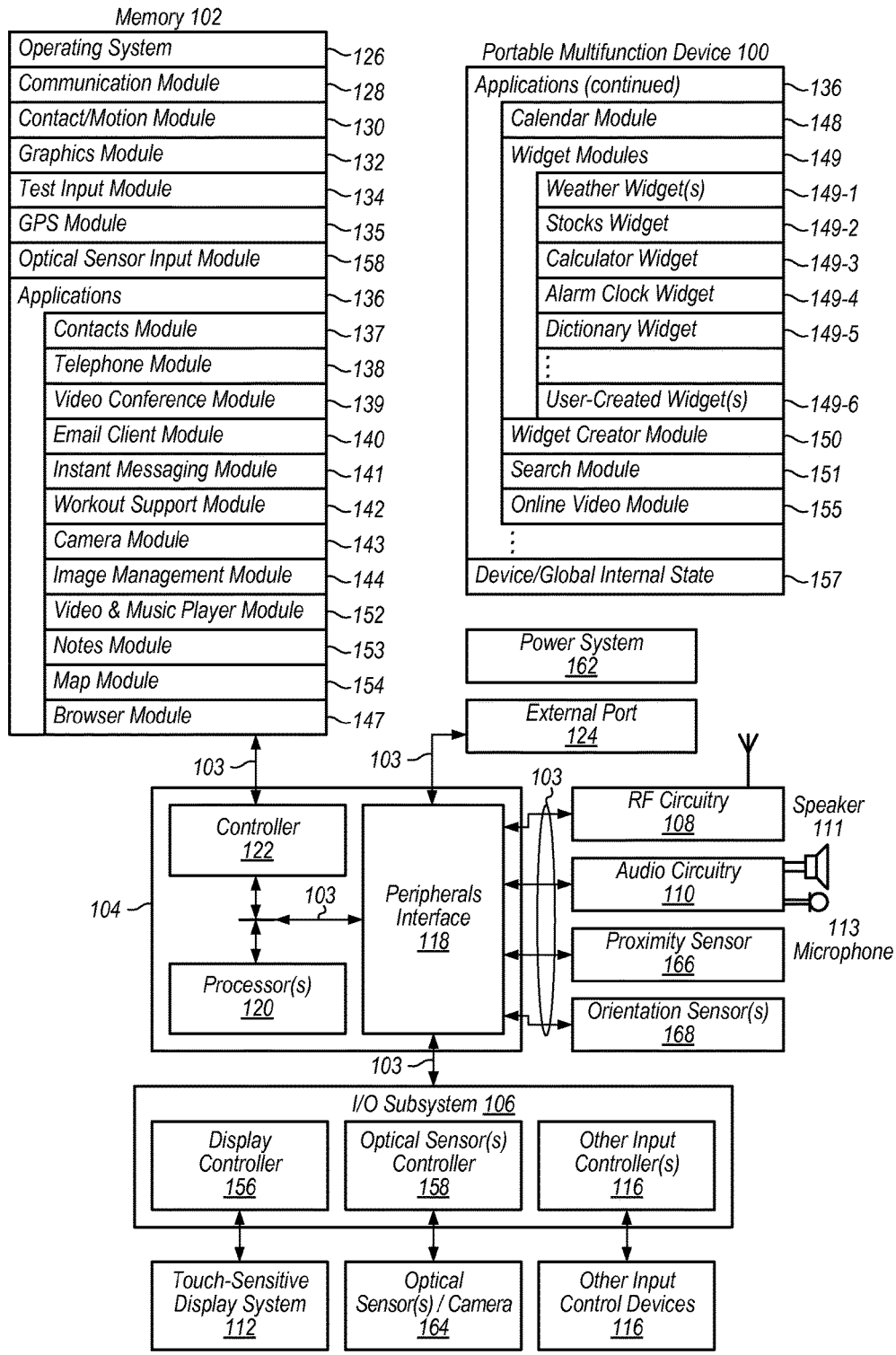
FIG. 1 illustrates a block diagram of a portable multifunction device with a camera in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Including." This term is open-ended. As used in the appended claims, this term does not foreclose additional structure or steps. Consider a claim that recites: "An apparatus including one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Introduction to Camera Module Embodiments

Some embodiments include a camera module. In some embodiments, the camera module includes an image sensor, a flexible printed circuit with a first side affixed to a first side of the image sensor, and a plurality of metallic leads affixed to a second side of the image sensor. In some embodiments, the first side of the image sensor is a side opposite the second side of the image sensor. In some embodiments, the leads provide connection between the image sensor and leads in the flexible printed circuit. In some embodiments, the camera module includes a lens assembly for directing light to the image sensor articulated to the image sensor by one or more of an overmoulding attached to the lead frame and the flexible printed circuit.

In some embodiments, the camera module includes a metallic strip for electromagnetic shielding of the image sensor. In some embodiments, the metallic strip is embedded in the overmoulding. In some embodiments, the camera module further includes a camera actuator motor articulated to the overmoulding for adjusting a position of a lens of the lens assembly relative to the image sensor. In some embodiments, In some embodiments, the lens assembly includes a fixed focus lens holder for maintaining a fixed position of a lens of the lens assembly relative to the image sensor.

In some embodiments, the camera module further includes a metallic stiffener affixed to a second side of the flexible printed circuit. In some embodiments, the second side of the flexible printed circuit is opposite a first side of the flexible printed circuit. In some embodiments, the metallic stiffener includes one or more ledges folded to enclose the overmoulding on one or more sides.

In some embodiments, the camera module further includes a metallic stiffener affixed to a second side of the flexible printed circuit. In some embodiments, the second side of the flexible printed circuit is opposite a first side of the flexible printed circuit.

In some embodiments, the camera module further includes a voice coil motor articulated to the overmoulding for adjusting a position of a lens of the lens assembly relative to the image sensor.

Some embodiments include an image sensor assembly. In some embodiments, the image sensor assembly includes an image sensor, a flexible printed circuit with a first side affixed to a first side of the image sensor, and a metallic stiffener affixed to a second side of the flexible printed circuit. In some embodiments, the second side of the flexible printed circuit is opposite a first side of the flexible printed circuit.

In some embodiments, the metallic stiffener includes one or more ledges folded to enclose the overmoulding on one or more sides. In some embodiments, the metallic stiffener includes one or more ledges epoxied to the overmoulding on one or more sides. In some embodiments, the image sensor assembly includes a plurality of metallic leads affixed to a second side of the image sensor. In some embodiments, the leads provide connection between the image sensor and leads in the flexible printed circuit.

In some embodiments, the image sensor assembly includes a plurality of metallic leads affixed to a second side of the image sensor. In some embodiments, the plurality of metallic leads provides a wire bond connection from the flexible printed circuit to the image sensor. In some embodiments, the image sensor assembly includes a plurality of metallic leads affixed to a second side of the image sensor. In some embodiments, the plurality of metallic leads provides a connection from the flexible printed circuit to the image sensor through a pillar bump including a copper alloy.

In some embodiments, the image sensor assembly includes a plurality of metallic leads affixed to a second side of the image sensor. In some embodiments, the first side of the image sensor is a side opposite the second side of the image sensor, and the leads provide connection between the image sensor and leads in the flexible printed circuit.

Some embodiments include a method for assembling an image sensor assembly. In some embodiments, the method includes attaching an image sensor to a flexible printed circuit with a first side affixed to a first side of the image sensor, and attaching a metallic stiffener to a second side of the flexible printed circuit. In some embodiments, the second side of the flexible printed circuit is opposite a first side of the flexible printed circuit.

In some embodiments, the method includes folding the metallic stiffener to create one or more ledges to enclose an overmoulding on one or more sides. In some embodiments, the method includes dispensing epoxy onto the metallic stiffener to secure one or more ledges to an overmoulding on one or more sides. In some embodiments, the method includes attaching a plurality of metallic leads affixed to a second side of the image sensor. In some embodiments, the leads provide connection between the image sensor and leads in the flexible printed circuit.

In some embodiments, the method includes attaching a plurality of metallic leads affixed to a second side of the image sensor. In some embodiments, the plurality of metallic leads provides a wire bond connection from the flexible printed circuit to the image sensor. In some embodiments, the method includes attaching a plurality of metallic leads affixed to a second side of the image sensor. In some embodiments, the plurality of metallic leads provides a connection from the flexible printed circuit to the image sensor through a pillar bump including a copper alloy.

Multifunction Device Examples

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Embodiments of electronic devices, user interfaces for such devices, and associated processes for using such devices are described. In some embodiments, the device is a portable communications device, such as a mobile telephone, that also contains other functions, such as PDA and/or music player functions. Example embodiments of portable multifunction devices include, without limitation, the iPhone®, iPod Touch®, and iPad® devices from Apple Inc. of Cupertino, Calif. Other portable electronic devices, such as laptops, cameras, cell phones, or tablet computers, may also be used. It should also be understood that, in some embodiments, the device is not a portable communications device, but is a desktop computer with a camera. In some embodiments, the device is a gaming computer with orientation sensors (e.g., orientation sensors in a gaming controller). In other embodiments, the device is not a portable communications device, but is a camera.

In the discussion that follows, an electronic device that includes a display and a touch-sensitive surface is described. It should be understood, however, that the electronic device may include one or more other physical user-interface devices, such as a physical keyboard, a mouse and/or a joystick.

The device typically supports a variety of applications, such as one or more of the following: a drawing application, a presentation application, a word processing application, a website creation application, a disk authoring application, a spreadsheet application, a gaming application, a telephone application, a video conferencing application, an e-mail application, an instant messaging application, a workout support application, a photo management application, a digital camera application, a digital video camera application, a web browsing application, a digital music player application, and/or a digital video player application.

The various applications that may be executed on the device may use at least one common physical user-interface device, such as the touch-sensitive surface. One or more functions of the touch-sensitive surface as well as corresponding information displayed on the device may be adjusted and/or varied from one application to the next and/or within a respective application. In this way, a common physical architecture (such as the touch-sensitive surface) of the device may support the variety of applications with user interfaces that are intuitive and transparent to the user.

Attention is now directed toward embodiments of portable devices with cameras. FIG. 1 is a block diagram illustrating portable multifunction device 100 with camera 164 in accordance with some embodiments. Camera 164 is sometimes called an "optical sensor" for convenience, and may also be known as or called an optical sensor system. Device 100 may include memory 102 (which may include one or more computer readable storage mediums), memory controller 122, one or more processing units (CPU's) 120, peripherals interface 118, RF circuitry 108, audio circuitry 110, speaker 111, touch-sensitive display system 112, microphone 113, input/output (I/O) subsystem 106, other input or control devices 116, and external port 124. Device 100 may include one or more optical sensors 164. These components may communicate over one or more communication buses or signal lines 103.

It should be appreciated that device 100 is only one example of a portable multifunction device, and that device 100 may have more or fewer components than shown, may combine two or more components, or may have a different configuration or arrangement of the components. The various components shown in FIG. 28 may be implemented in hardware, software, or a combination of hardware and software, including one or more signal processing and/or application specific integrated circuits.

Memory 102 may include high-speed random access memory and may also include non-volatile memory, such as one or more magnetic disk storage devices, flash memory devices, or other non-volatile solid-state memory devices. Access to memory 102 by other components of device 100, such as CPU 120 and the peripherals interface 118, may be controlled by memory controller 122.

Peripherals interface 118 can be used to couple input and output peripherals of the device to CPU 120 and memory 102. The one or more processors 120 run or execute various software programs and/or sets of instructions stored in memory 102 to perform various functions for device 100 and to process data.

In some embodiments, peripherals interface 118, CPU 120, and memory controller 122 may be implemented on a single chip, such as chip 104. In some other embodiments, they may be implemented on separate chips.

RF (radio frequency) circuitry 108 receives and sends RF signals, also called electromagnetic signals. RF circuitry 108 converts electrical signals to/from electromagnetic signals and communicates with communications networks and other communications devices via the electromagnetic signals. RF circuitry 108 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 108 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VoIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 110, speaker 111, and microphone 113 provide an audio interface between a user and device 100. Audio circuitry 110 receives audio data from peripherals interface 118, converts the audio data to an electrical signal, and transmits the electrical signal to speaker 111. Speaker 111 converts the electrical signal to human-audible sound waves. Audio circuitry 110 also receives electrical signals converted by microphone 113 from sound waves. Audio circuitry 110 converts the electrical signal to audio data and transmits the audio data to peripherals interface 118 for processing. Audio data may be retrieved from and/or transmitted to memory 102 and/or RF circuitry 108 by peripherals interface 118. In some embodiments, audio circuitry 110 also includes a headset jack (e.g., 212, FIG. 2). The headset jack provides an interface between audio circuitry 110 and removable audio input/output peripherals, such as output-only headphones or a headset with both output (e.g., a headphone for one or both ears) and input (e.g., a microphone).

I/O subsystem 106 couples input/output peripherals on device 100, such as touch screen 112 and other input control devices 116, to peripherals interface 118. I/O subsystem 106 may include display controller 156 and one or more input controllers 160 for other input or control devices. The one or more input controllers 160 receive/send electrical signals from/to other input or control devices 116. The other input control devices 116 may include physical buttons (e.g., push buttons, rocker buttons, etc.), dials, slider switches, joysticks, click wheels, and so forth. In some alternate embodiments, input controller(s) 160 may be coupled to any (or none) of the following: a keyboard, infrared port, USB port, and a pointer device such as a mouse. The one or more buttons (e.g., 208, FIG. 2) may include an up/down button for volume control of speaker 111 and/or microphone 113. The one or more buttons may include a push button (e.g., 206, FIG. 2).

Touch-sensitive display 112 provides an input interface and an output interface between the device and a user. Display controller 156 receives and/or sends electrical signals from/to touch screen 112. Touch screen 112 displays visual output to the user. The visual output may include graphics, text, icons, video, and any combination thereof (collectively termed "graphics"). In some embodiments, some or all of the visual output may correspond to user-interface objects.

Touch screen 112 has a touch-sensitive surface, sensor or set of sensors that accepts input from the user based on haptic and/or tactile contact. Touch screen 112 and display controller 156 (along with any associated modules and/or sets of instructions in memory 102) detect contact (and any movement or breaking of the contact) on touch screen 112 and converts the detected contact into interaction with user-interface objects (e.g., one or more soft keys, icons, web pages or images) that are displayed on touch screen 112. In an example embodiment, a point of contact between touch screen 112 and the user corresponds to a finger of the user.

Touch screen 112 may use LCD (liquid crystal display) technology, LPD (light emitting polymer display) technology, or LED (light emitting diode) technology, although other display technologies may be used in other embodiments. Touch screen 112 and display controller 156 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 112. In an example embodiment, projected mutual capacitance sensing technology is used.

Touch screen 112 may have a video resolution in excess of 100 dpi. In some embodiments, the touch screen has a video resolution of approximately 160 dpi. The user may make contact with touch screen 112 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 100 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 112 or an extension of the touch-sensitive surface formed by the touch screen.

Device 100 also includes power system 162 for powering the various components. Power system 162 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 100 may also include one or more optical sensors or cameras 164. FIG. 28 shows an optical sensor coupled to optical sensor controller 158 in I/O subsystem 106. Optical sensor 164 may include charge-coupled device (CCD) or complementary metal-oxide semiconductor (CMOS) phototransistors. Optical sensor 164 receives light from the environment, projected through one or more lens, and converts the light to data representing an image, video, and/or other optical data such as a depth map. In conjunction with imaging module 143 (also called a camera module), optical sensor 164 may capture still images, video, and/or other optical data such as depth maps. In some embodiments, an optical sensor is located on the back of device 100, opposite touch screen display 112 on the front of the device, so that the touch screen display may be used as a viewfinder for still and/or video image acquisition. In some embodiments, another optical sensor is located on the front of the device so that the user's image may be obtained for videoconferencing while the user views the other video conference participants on the touch screen display. While a optical sensor input module 158 is explicitly shown in FIG. 1, a person of ordinary skill in the art will readily ascertain, in light of having read the present disclosure, that the methods, processes and systems described herein may be implemented in many of the hardware and software components and systems described herein without departing from the scope and intent of the present disclosure.

Device 100 may also include one or more proximity sensors 166. FIG. 28 shows proximity sensor 166 coupled to peripherals interface 118. Alternately, proximity sensor 166 may be coupled to input controller 160 in I/O subsystem 106. In some embodiments, the proximity sensor turns off and disables touch screen 112 when the multifunction device is placed near the user's ear (e.g., when the user is making a phone call).

Device 100 includes one or more orientation sensors 168. In some embodiments, the one or more orientation sensors include one or more accelerometers (e.g., one or more linear accelerometers and/or one or more rotational accelerometers). In some embodiments, the one or more orientation sensors include one or more gyroscopes. In some embodiments, the one or more orientation sensors include one or more magnetometers. In some embodiments, the one or more orientation sensors include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 100. In some embodiments, the one or more orientation sensors include any combination of orientation/rotation sensors. FIG. 28 shows the one or more orientation sensors 168 coupled to peripherals interface 118. Alternately, the one or more orientation sensors 168 may be coupled to an input controller 160 in I/O subsystem 106. In some embodiments, information is displayed on the touch screen display in a portrait view or a landscape view based on an analysis of data received from the one or more orientation sensors.

In some embodiments, the software components stored in memory 102 include operating system 126, communication module (or set of instructions) 128, contact/motion module (or set of instructions) 130, graphics module (or set of instructions) 132, text input module (or set of instructions) 134, Global Positioning System (GPS) module (or set of instructions) 135, optical sensor input module 158 and applications (or sets of instructions) 136. Furthermore, in some embodiments memory 102 stores device/global internal state 157. Device/global internal state 157 includes one or more of: active application state, indicating which applications, if any, are currently active; display state, indicating what applications, views or other information occupy various regions of touch screen display 112; sensor state, including information obtained from the device's various sensors and input control devices 116; and location information concerning the device's location and/or attitude.

Operating system 126 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 128 facilitates communication with other devices over one or more external ports 124 and also includes various software components for handling data received by RF circuitry 108 and/or external port 124. External port 124 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector.

Contact/motion module 130 may detect contact with touch screen 112 (in conjunction with display controller 156) and other touch sensitive devices (e.g., a touchpad or physical click wheel). Contact/motion module 130 includes various software components for performing various operations related to detection of contact, such as determining if contact has occurred (e.g., detecting a finger-down event), determining if there is movement of the contact and tracking the movement across the touch-sensitive surface (e.g., detecting one or more finger-dragging events), and determining if the contact has ceased (e.g., detecting a finger-up event or a break in contact). Contact/motion module 130 receives contact data from the touch-sensitive surface. Determining movement of the point of contact, which is represented by a series of contact data, may include determining speed (magnitude), velocity (magnitude and direction), and/or an acceleration (a change in magnitude and/or direction) of the point of contact. These operations may be applied to single contacts (e.g., one finger contacts) or to multiple simultaneous contacts (e.g., "multitouch"/multiple finger contacts). In some embodiments, contact/motion module 130 and display controller 156 detect contact on a touchpad.

Contact/motion module 130 may detect a gesture input by a user. Different gestures on the touch-sensitive surface have different contact patterns. Thus, a gesture may be detected by detecting a particular contact pattern. For example, detecting a finger tap gesture includes detecting a finger-down event followed by detecting a finger-up (lift off) event at the same position (or substantially the same position) as the finger-down event (e.g., at the position of an icon). As another example, detecting a finger swipe gesture on the touch-sensitive surface includes detecting a finger-down event followed by detecting one or more finger-dragging events, and subsequently followed by detecting a finger-up (lift off) event.

Graphics module 132 includes various known software components for rendering and displaying graphics on touch screen 112 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like.

In some embodiments, graphics module 132 stores data representing graphics to be used. Each graphic may be assigned a corresponding code. Graphics module 132 receives, from applications etc., one or more codes specifying graphics to be displayed along with, if necessary, coordinate data and other graphic property data, and then generates screen image data to output to display controller 156.

Text input module 134, which may be a component of graphics module 132, provides soft keyboards for entering text in various applications (e.g., contacts 137, e-mail 140, IM 141, browser 147, and any other application that needs text input).

GPS module 135 determines the location of the device and provides this information for use in various applications (e.g., to telephone 138 for use in location-based dialing, to camera 143 as picture/video metadata, and to applications that provide location-based services such as weather widgets, local yellow page widgets, and map/navigation widgets).

Applications 136 may include the following modules (or sets of instructions), or a subset or superset thereof:

- contacts module 137 (sometimes called an address book or contact list);
- telephone module 138;
- video conferencing module 139;
- e-mail client module 140;
- instant messaging (IM) module 141;
- workout support module 142;
- camera module 143 for still and/or video images;
- image management module 144;
- browser module 147;
- calendar module 148;
- widget modules 149, which may include one or more of: weather widget 149-1, stocks widget 149-2, calculator widget 149-3, alarm clock widget 149-4, dictionary widget 149-5, and other widgets obtained by the user, as well as user-created widgets 149-6;
- widget creator module 150 for making user-created widgets 149-6;
- search module 151;
- video and music player module 152, which may be made up of a video player
- module and a music player module;
- notes module 153;
- map module 154; and/or
- online video module 155.

Examples of other applications 136 that may be stored in memory 102 include other word processing applications, other image editing applications, drawing applications, presentation applications, JAVA-enabled applications, encryption, digital rights management, voice recognition, and voice replication.

In conjunction with touch screen 112, display controller 156, contact module 130, graphics module 132, and text input module 134, contacts module 137 may be used to manage an address book or contact list (e.g., stored in application internal state 192 of contacts module 137 in memory 102 or memory 370), including: adding name(s) to the address book; deleting name(s) from the address book; associating telephone number(s), e-mail address(es), physical address(es) or other information with a name; associating an image with a name; categorizing and sorting names; providing telephone numbers or e-mail addresses to initiate and/or facilitate communications by telephone 138, video conference 139, e-mail 140, or IM 141; and so forth.

In conjunction with RF circuitry 108, audio circuitry 110, speaker 111, microphone 113, touch screen 112, display controller 156, contact module 130, graphics module 132, and text input module 134, telephone module 138 may be used to enter a sequence of characters corresponding to a telephone number, access one or more telephone numbers in address book 137, modify a telephone number that has been entered, dial a respective telephone number, conduct a conversation and disconnect or hang up when the conversation is completed. As noted above, the wireless communication may use any of a variety of communications standards, protocols and technologies.

In conjunction with RF circuitry 108, audio circuitry 110, speaker 111, microphone 113, touch screen 112, display controller 156, optical sensor 164, optical sensor controller 158, contact module 130, graphics module 132, text input module 134, contact list 137, and telephone module 138, videoconferencing module 139 includes executable instructions to initiate, conduct, and terminate a video conference between a user and one or more other participants in accordance with user instructions.

In conjunction with RF circuitry 108, touch screen 112, display controller 156, contact module 130, graphics module 132, and text input module 134, e-mail client module 140 includes executable instructions to create, send, receive, and manage e-mail in response to user instructions. In conjunction with image management module 144, e-mail client module 140 makes it very easy to create and send e-mails with still or video images taken with camera module 143.

In conjunction with RF circuitry 108, touch screen 112, display controller 156, contact module 130, graphics module 132, and text input module 134, the instant messaging module 141 includes executable instructions to enter a sequence of characters corresponding to an instant message, to modify previously entered characters, to transmit a respective instant message (for example, using a Short Message Service (SMS) or Multimedia Message Service (MMS) protocol for telephony-based instant messages or using XMPP, SIMPLE, or IMPS for Internet-based instant messages), to receive instant messages and to view received instant messages. In some embodiments, transmitted and/or received instant messages may include graphics, photos, audio files, video files and/or other attachments as are supported in a MMS and/or an Enhanced Messaging Service (EMS). As used herein, "instant messaging" refers to both telephony-based messages (e.g., messages sent using SMS or MMS) and Internet-based messages (e.g., messages sent using XMPP, SIMPLE, or IMPS).

In conjunction with RF circuitry 108, touch screen 112, display controller 156, contact module 130, graphics module 132, text input module 134, GPS module 135, map module 154, and music player module 146, workout support module 142 includes executable instructions to create workouts (e.g., with time, distance, and/or calorie burning goals); communicate with workout sensors (sports devices); receive workout sensor data; calibrate sensors used to monitor a workout; select and play music for a workout; and display, store and transmit workout data.

In conjunction with touch screen 112, display controller 156, optical sensor(s) 164, optical sensor controller 158, contact module 130, graphics module 132, and image management module 144, camera module 143 includes executable instructions to capture still images or video (including a video stream) and store them into memory 102, modify characteristics of a still image or video, or delete a still image or video from memory 102.

In conjunction with touch screen 112, display controller 156, contact module 130, graphics module 132, text input module 134, and camera module 143, image management module 144 includes executable instructions to arrange, modify (e.g., edit), or otherwise manipulate, label, delete, present (e.g., in a digital slide show or album), and store still and/or video images.

In conjunction with RF circuitry 108, touch screen 112, display system controller 156, contact module 130, graphics module 132, and text input module 134, browser module 147 includes executable instructions to browse the Internet in accordance with user instructions, including searching, linking to, receiving, and displaying web pages or portions thereof, as well as attachments and other files linked to web pages.

In conjunction with RF circuitry 108, touch screen 112, display system controller 156, contact module 130, graphics module 132, text input module 134, e-mail client module 140, and browser module 147, calendar module 148 includes executable instructions to create, display, modify, and store calendars and data associated with calendars (e.g., calendar entries, to do lists, etc.) in accordance with user instructions.

In conjunction with RF circuitry 108, touch screen 112, display system controller 156, contact module 130, graphics module 132, text input module 134, and browser module 147, widget modules 149 are mini-applications that may be downloaded and used by a user (e.g., weather widget 149-1, stocks widget 149-2, calculator widget 1493, alarm clock widget 149-4, and dictionary widget 149-5) or created by the user (e.g., user-created widget 149-6). In some embodiments, a widget includes an HTML (Hypertext Markup Language) file, a CSS (Cascading Style Sheets) file, and a JavaScript file. In some embodiments, a widget includes an XML (Extensible Markup Language) file and a JavaScript file (e.g., Yahoo! Widgets).

In conjunction with RF circuitry 108, touch screen 112, display system controller 156, contact module 130, graphics module 132, text input module 134, and browser module 147, the widget creator module 150 may be used by a user to create widgets (e.g., turning a user-specified portion of a web page into a widget).

In conjunction with touch screen 112, display system controller 156, contact module 130, graphics module 132, and text input module 134, search module 151 includes executable instructions to search for text, music, sound, image, video, and/or other files in memory 102 that match one or more search criteria (e.g., one or more user-specified search terms) in accordance with user instructions.

In conjunction with touch screen 112, display system controller 156, contact module 130, graphics module 132, audio circuitry 110, speaker 111, RF circuitry 108, and browser module 147, video and music player module 152 includes executable instructions that allow the user to download and play back recorded music and other sound files stored in one or more file formats, such as MP3 or AAC files, and executable instructions to display, present or otherwise play back videos (e.g., on touch screen 112 or on an external, connected display via external port 124). In some embodiments, device 100 may include the functionality of an MP3 player.

In conjunction with touch screen 112, display controller 156, contact module 130, graphics module 132, and text input module 134, notes module 153 includes executable instructions to create and manage notes, to do lists, and the like in accordance with user instructions.

In conjunction with RF circuitry 108, touch screen 112, display system controller 156, contact module 130, graphics module 132, text input module 134, GPS module 135, and browser module 147, map module 154 may be used to receive, display, modify, and store maps and data associated with maps (e.g., driving directions; data on stores and other points of interest at or near a particular location; and other location-based data) in accordance with user instructions.

In conjunction with touch screen 112, display system controller 156, contact module 130, graphics module 132, audio circuitry 110, speaker 111, RF circuitry 108, text input module 134, e-mail client module 140, and browser module 147, online video module 155 includes instructions that allow the user to access, browse, receive (e.g., by streaming and/or download), play back (e.g., on the touch screen or on an external, connected display via external port 124), send an e-mail with a link to a particular online video, and otherwise manage online videos in one or more file formats, such as H.264. In some embodiments, instant messaging module 141, rather than e-mail client module 140, is used to send a link to a particular online video.

Each of the above identified modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 102 may store a subset of the modules and data structures identified above. Furthermore, memory 102 may store additional modules and data structures not described above.

In some embodiments, device 100 is a device where operation of a predefined set of functions on the device is performed exclusively through a touch screen and/or a touchpad. By using a touch screen and/or a touchpad as the primary input control device for operation of device 100, the number of physical input control devices (such as push buttons, dials, and the like) on device 100 may be reduced.

The predefined set of functions that may be performed exclusively through a touch screen and/or a touchpad include navigation between user interfaces. In some embodiments, the touchpad, when touched by the user, navigates device 100 to a main, home, or root menu from any user interface that may be displayed on device 100. In such embodiments, the touchpad may be referred to as a "menu button." In some other embodiments, the menu button may be a physical push button or other physical input control device instead of a touchpad.

Figure 2:
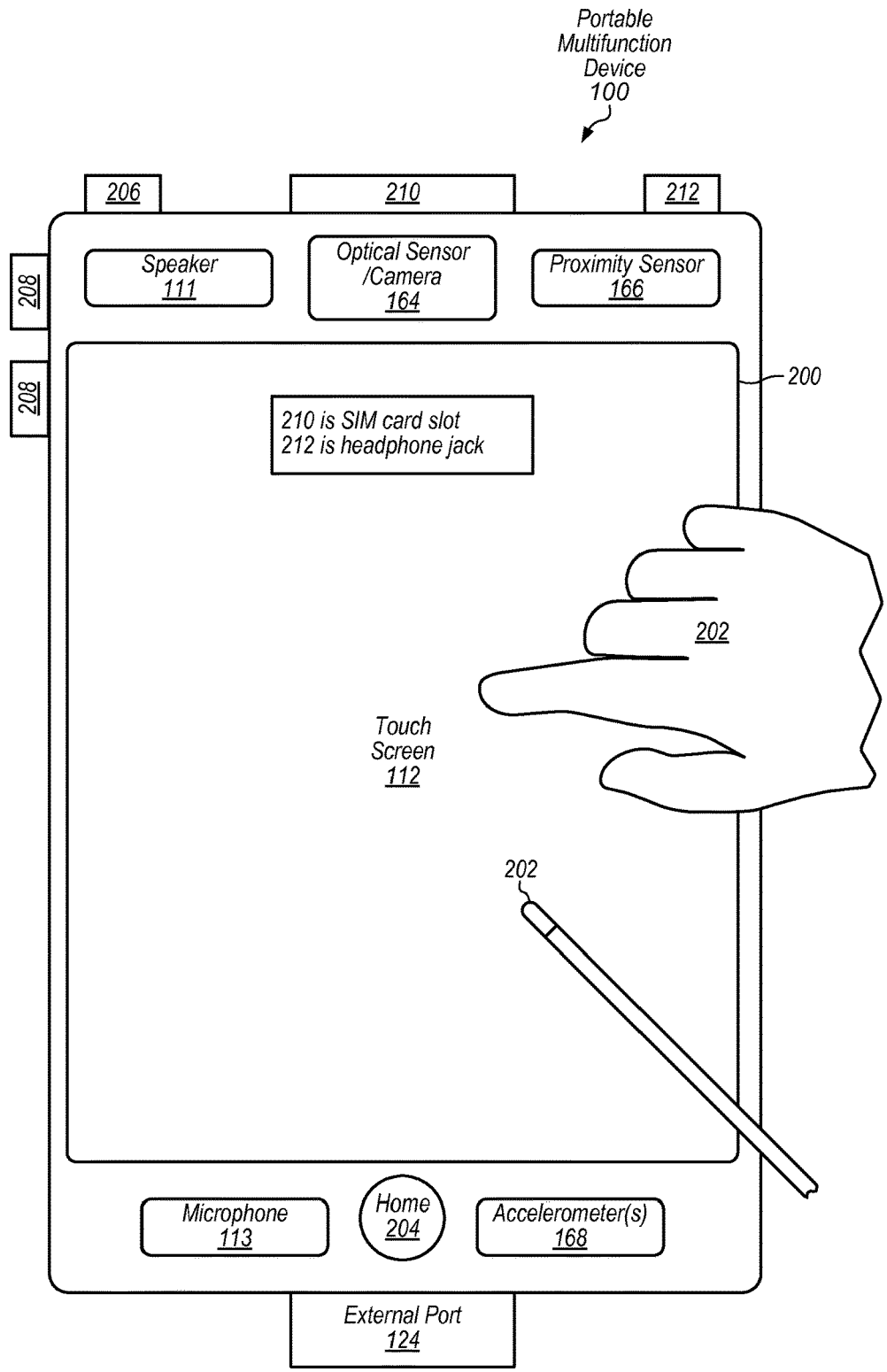
FIG. 2 depicts a portable multifunction device having a camera in accordance with some embodiments.

FIG. 2 illustrates a portable multifunction device 100 having a touch screen 112 in accordance with some embodiments. The touch screen may display one or more graphics within user interface (UI) 200. In this embodiment, as well as others described below, a user may select one or more of the graphics by making a gesture on the graphics, for example, with one or more fingers 202 (not drawn to scale in the figure) or one or more styluses 203 (not drawn to scale in the figure).

Device 100 may also include one or more physical buttons, such as "home" or menu button 204. As described previously, menu button 204 may be used to navigate to any application 136 in a set of applications that may be executed on device 100. Alternatively, in some embodiments, the menu button is implemented as a soft key in a GUI displayed on touch screen 112.

In one embodiment, device 100 includes touch screen 112, menu button 204, push button 206 for powering the device on/off and locking the device, volume adjustment button(s) 208, Subscriber Identity Module (SIM) card slot 210, head set jack 212, and docking/charging external port 124. Push button 206 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also may accept verbal input for activation or deactivation of some functions through microphone 113.

It should be noted that, although many of the examples herein are given with reference to optical sensor/camera 164 (on the front of a device), a rear-facing camera or optical sensor that is pointed opposite from the display may be used instead of or in addition to an optical sensor/camera 164 on the front of a device.

Example Camera Hardware Embodiments

Figure 3A:
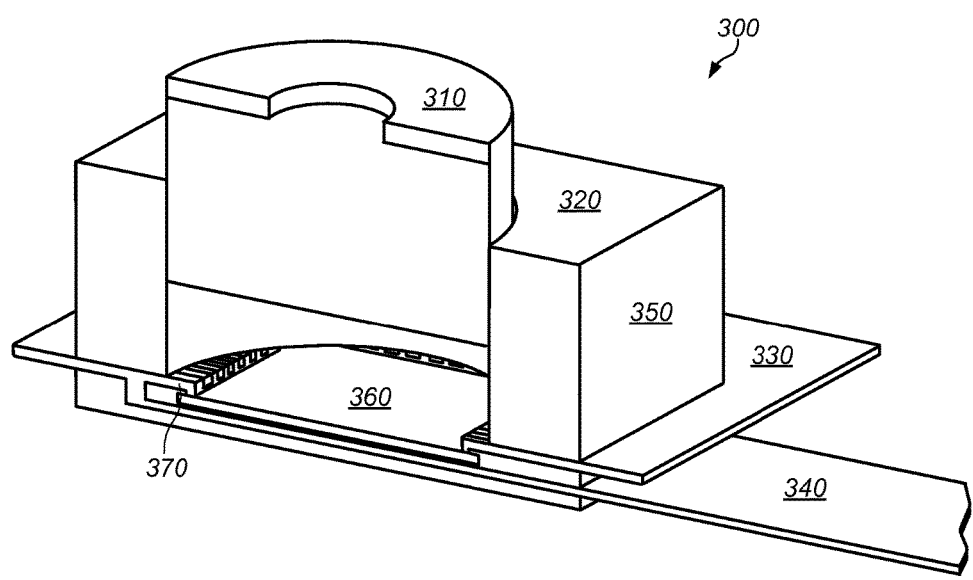
FIG. 3A illustrates a cutaway view of an example embodiment of a camera module or assembly that may, for example, be used to provide in small form factor cameras, according to at least some embodiments.

FIG. 3A illustrates a cutaway view of an example embodiment of a camera module or assembly that may, for example, be used to provide in small form factor cameras, according to at least some embodiments. As shown in FIG. 3A, the camera module 300 includes an image sensor 360 and a flexible printed circuit 340 with a first side affixed to a first side of the image sensor 360. In some embodiments, a plurality of metallic leads (e.g., 370) are attached to a lead frame 330 and affix to a second side of the image sensor 360. In some embodiments, the first side of the image sensor 360 is a side opposite the second side of the image sensor 360. In some embodiments, the leads (e.g., 370) provide connection between the image sensor 360 and corresponding leads (not visible) in or on the flexible printed circuit 340. In some embodiments, a lens assembly 310 for directing light to the image sensor 360 is articulated to the image sensor 360 by one or more of an overmoulding 320 attached to the lead frame 330 and the flexible printed circuit 340.

In some embodiments, a metallic strip 350 is attached to the overmoulding 320 for electromagnetic shielding of the image sensor 360. In some embodiments, the electromagnetic strip 350 is embedded in the overmoulding 320.

In some alternative embodiments, the camera module 300 further includes a camera actuator motor (not shown) articulated to the overmoulding 320 for adjusting a position of a lens of the lens assembly 310 relative to the image sensor 360.

In some embodiments, the lens assembly 310 includes a fixed focus lens holder for maintaining a fixed position of a lens of the lens assembly 310 relative to the image sensor 360.

Figure 3B:
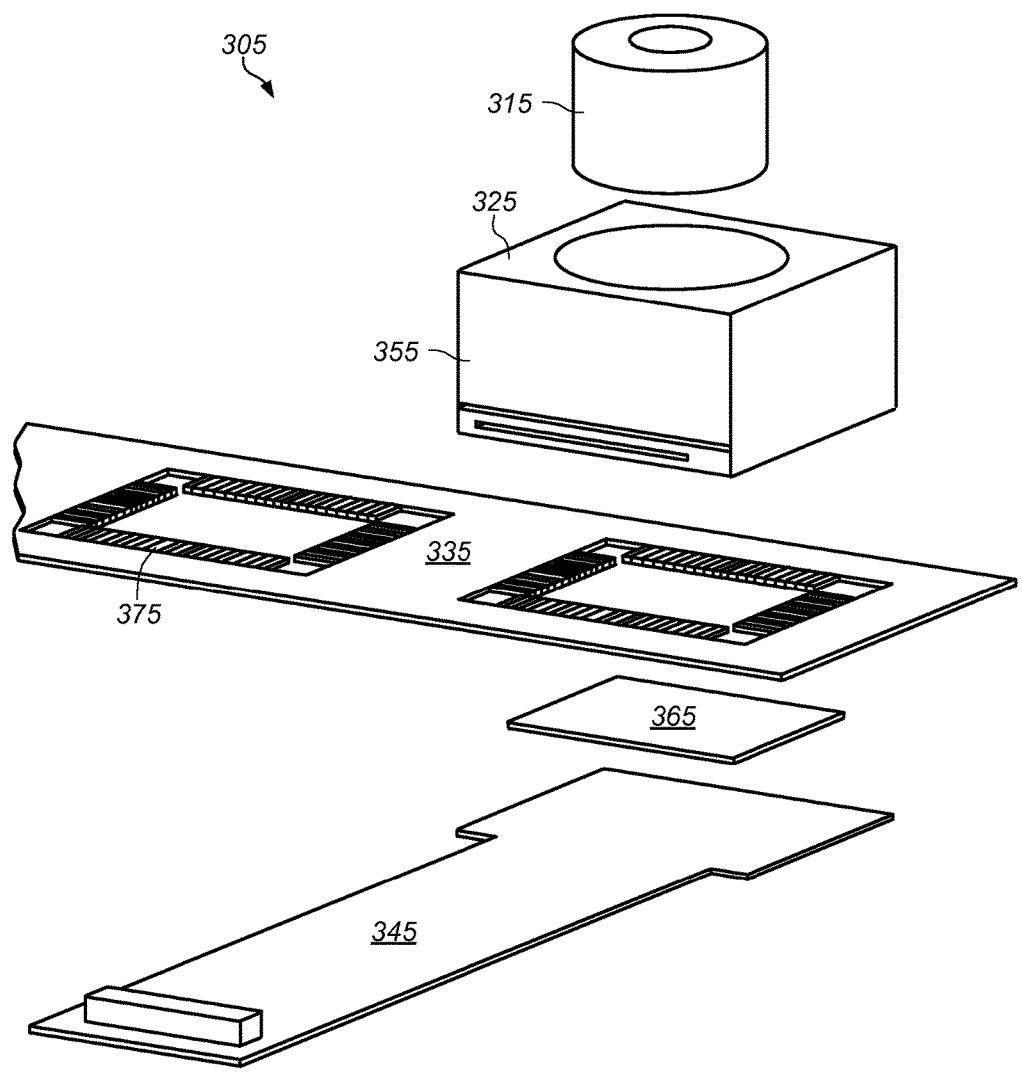
FIG. 3B depicts an exploded parts view of an example embodiment of a camera module or assembly that may, for example, be used to provide in small form factor cameras, according to at least some embodiments.

FIG. 3B depicts an exploded parts view of an example embodiment of a camera module or assembly that may, for example, be used to provide in small form factor cameras, according to at least some embodiments. As shown in the exploded view of FIG. 3B, the camera module 305 includes an image sensor 365 and a flexible printed circuit 345 with a first side that can be affixed to a first side of the image sensor 365. In some embodiments, a plurality of metallic leads (e.g., 375) are attached to a lead frame 330 and available to be affixed to a second side of the image sensor 365. In some embodiments, the first side of the image sensor 365 is a side opposite the second side of the image sensor 365. In some embodiments, the leads (e.g., 375) provide connection between the image sensor 365 and corresponding leads (not visible) in or on the flexible printed circuit 345. In some embodiments, a lens assembly 315 for directing light to the image sensor 365 is articulated to the image sensor 365 by one or more of an overmoulding 325 attached to the lead frame 335 and the flexible printed circuit 345. In some embodiments, the lead frame 335 is removed during assembly to leave only the leads in place.

In some embodiments, a metallic strip 355 is attached to the overmoulding 325 for electromagnetic shielding of the image sensor 365. In some embodiments, the electromagnetic strip 355 is embedded in the overmoulding 325.

In some alternative embodiments, the camera module 305 further includes a camera actuator motor (not shown) articulated to the overmoulding 325 for adjusting a position of a lens of the lens assembly 315 relative to the image sensor 365.

In some embodiments, the lens assembly 315 includes a fixed focus lens holder for maintaining a fixed position of a lens of the lens assembly 315 relative to the image sensor 365. In some embodiments, image sensor 365 will have a TSV/RDL at the bottom that connects directly to the flexible printed circuit 345.

Example Camera Hardware Embodiment Assembly Process

Figure 3C:
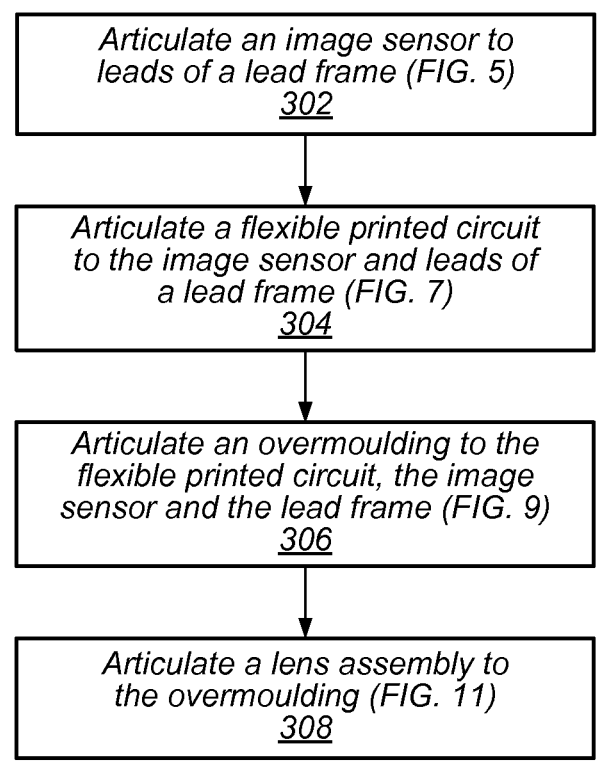
FIG. 3C is a flowchart of an assembly process for assembling a camera module, according to at least some embodiments.

FIG. 3C is a flowchart of an assembly process for assembling a camera module, according to at least some embodiments. An image sensor is articulated to leads of a lead frame (block 302). An example of such an operation is visible as FIG. 5. A flexible printed circuit is articulated to the image sensor and leads of the lead frame (block 304). An example of such an operation is visible as FIG. 7. An overmoulding is articulated to the flexible printed circuit, the image sensor and the lead frame (block 306). An example of such an operation is visible as FIG. 9 A lens assembly is articulated to the overmoulding (block 308). An example of such an operation is visible as FIG. 11.

Figure 4:
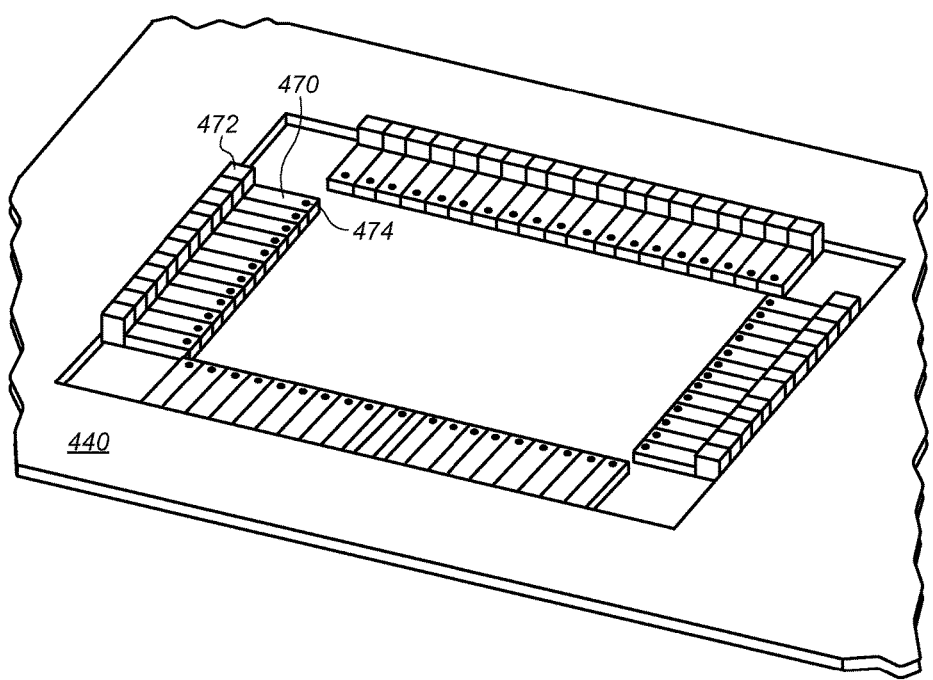
FIG. 4 depicts a lead frame apparatus representing an embodiment of a lead frame for an image sensor that may, for example, be used in small form factor cameras, according to at least some embodiments.

FIG. 4 depicts a lead frame apparatus representing an embodiment of a lead frame for an image sensor that may, for example, be used in small form factor cameras, according to at least some embodiments. Lead frame 440 includes an array of leads (e.g., 470) to provide connection between the image sensor (not shown) and corresponding leads (not visible) in or on the flexible printed circuit (not shown) by means of contact pads 472 and 474.

Figure 5:
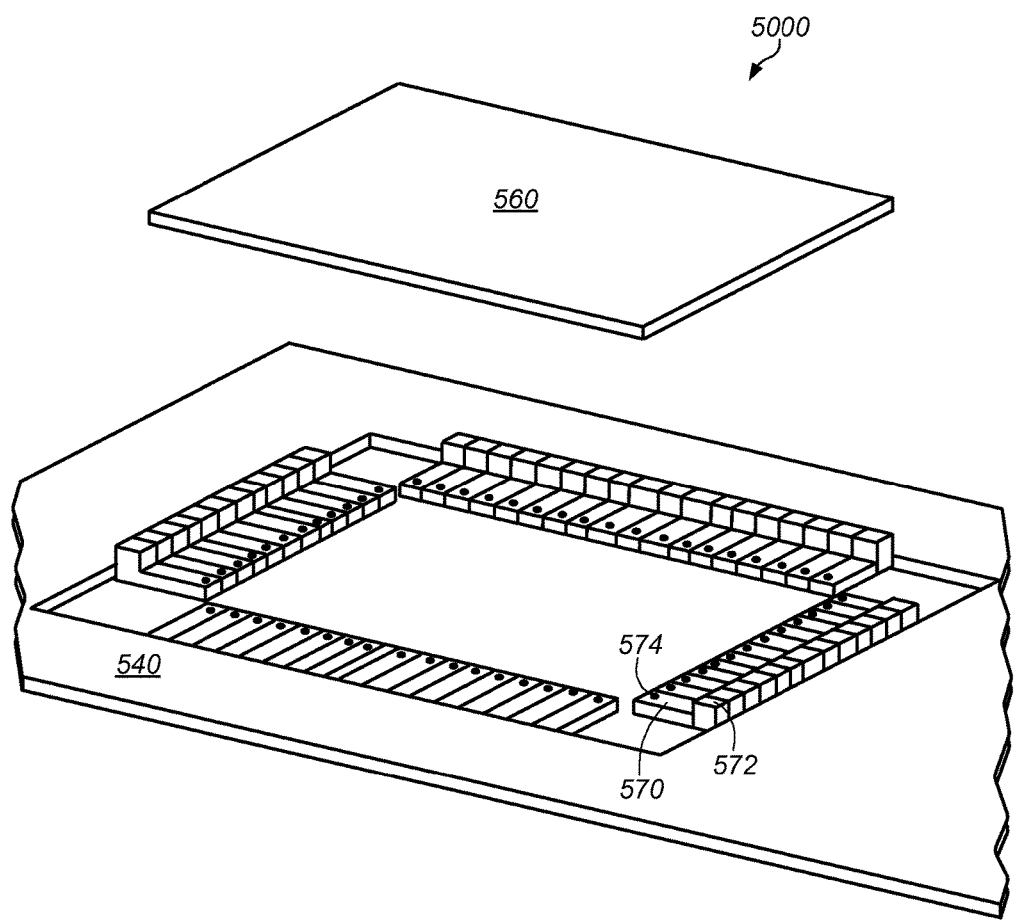
FIG. 5 illustrates a lead frame apparatus and an image sensor that may, for example, be used in small form factor cameras, according to at least some embodiments.

FIG. 5 illustrates a lead frame apparatus and an image sensor that may, for example, be used in small form factor cameras, according to at least some embodiments. Lead frame 540 includes an array of leads (e.g., 570) to provide connection between the image sensor (560) and corresponding leads (not visible) in or on the flexible printed circuit (not shown) by means of contact pads 572 and 574.

Figure 6:
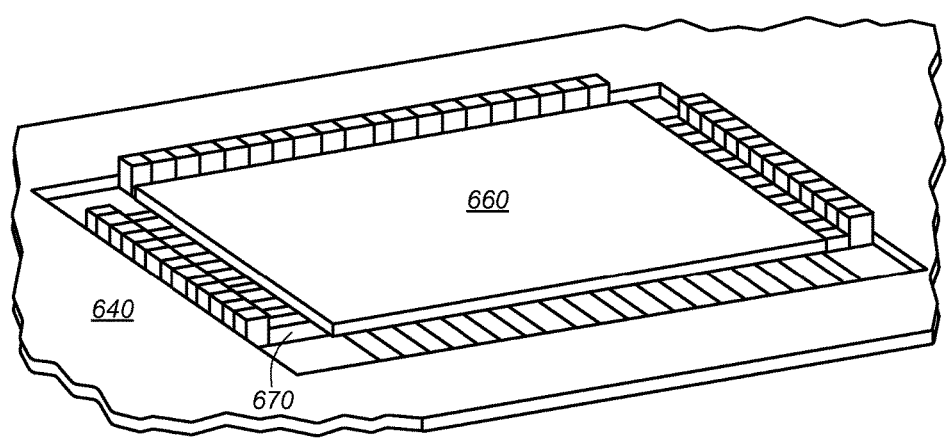
FIG. 6 depicts articulation of a lead frame apparatus and an image sensor that may, for example, be used in small form factor cameras, according to at least some embodiments.

FIG. 6 depicts articulation of a lead frame apparatus and an image sensor that may, for example, be used in small form factor cameras, according to at least some embodiments. Lead frame 640 includes an array of leads (e.g., 670) to provide connection between the image sensor (660) and corresponding leads (not visible) in or on the flexible printed circuit (not shown).

Figure 7:
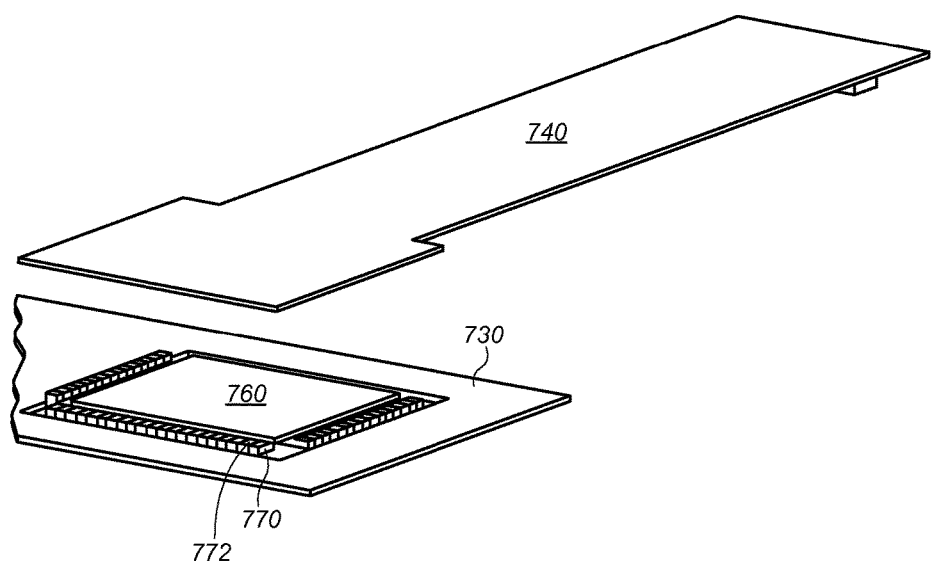
FIG. 7 illustrates articulation of a flexible printed circuit to a lead frame apparatus and an image sensor that may, for example, be used in small form factor cameras, according to at least some embodiments.

FIG. 7 illustrates articulation of a flexible printed circuit to a lead frame apparatus and an image sensor that may, for example, be used in small form factor cameras, according to at least some embodiments. FIG. 7 shows an image sensor 760 and a flexible printed circuit 740 with a first side that can be affixed to a first side of the image sensor 760. In some embodiments, a plurality of metallic leads (e.g., 770) are attached to a lead frame 730 and available to be affixed to a second side of the image sensor 760. In some embodiments, the first side of the image sensor 760 is a side opposite the second side of the image sensor 760. In some embodiments, the leads (e.g., 770) provide connection between the image sensor 760 and corresponding leads (not visible) in or on the flexible printed circuit 740.

Figure 8:
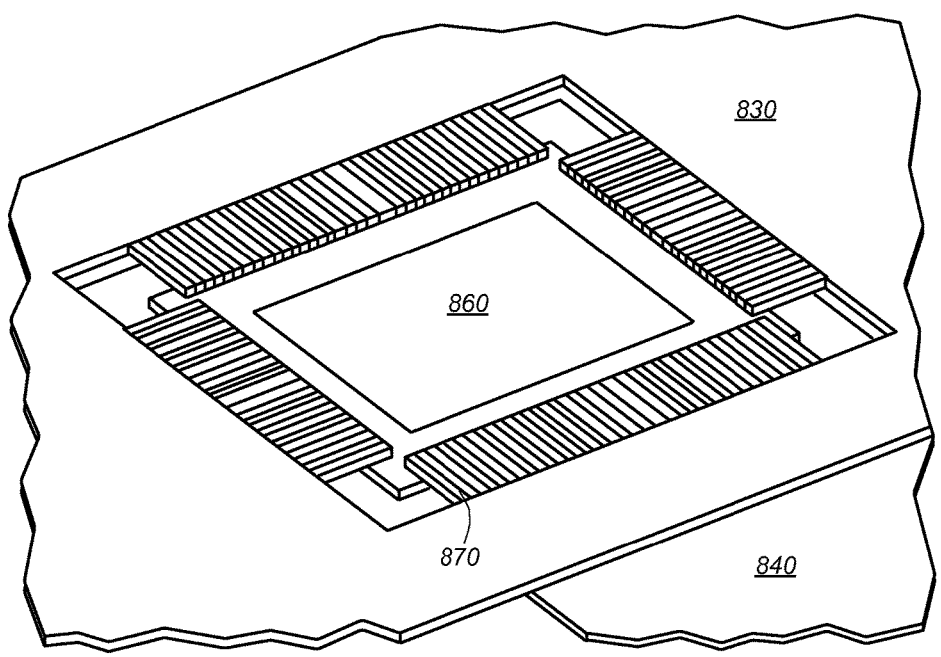
FIG. 8 depicts an assembly resulting from articulation of a flexible printed circuit to a lead frame apparatus and an image sensor that may, for example, be used in small form factor cameras, according to at least some embodiments.

FIG. 8 depicts an assembly resulting from articulation of a flexible printed circuit to a lead frame apparatus and an image sensor that may, for example, be used in small form factor cameras, according to at least some embodiments. FIG. 8 shows an image sensor 860 and a flexible printed circuit 840 with a first side that can be affixed to a first side of the image sensor 860. In some embodiments, a plurality of metallic leads (e.g., 870) are attached to a lead frame 830 and available to be affixed to a second side of the image sensor 860. In some embodiments, the first side of the image sensor 860 is a side opposite the second side of the image sensor 860. In some embodiments, the leads (e.g., 870) provide connection between the image sensor 860 and corresponding leads (not visible) in or on the flexible printed circuit 840.

Figure 9:
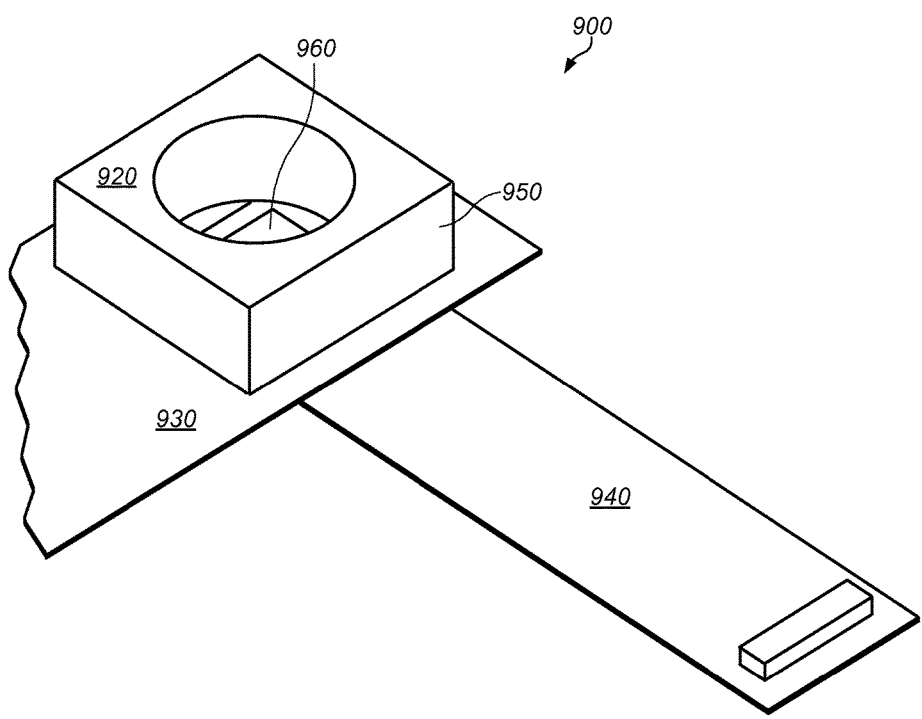
FIG. 9 illustrates an assembly resulting from articulation of an overmoulding to a flexible printed circuit, a lead frame apparatus, and an image sensor that may, for example, be used in small form factor cameras, according to at least some embodiments.

FIG. 9 illustrates an assembly resulting from articulation of an overmoulding to a flexible printed circuit, a lead frame apparatus, and an image sensor that may, for example, be used in small form factor cameras, according to at least some embodiments. As shown in FIG. 9, the camera assembly 900 includes an image sensor 960 and a flexible printed circuit 940 with a first side affixed to a first side of the image sensor 960. In some embodiments, a plurality of metallic leads (not visible) are attached to a lead frame 930 and affix to a second side of the image sensor 960. In some embodiments, the first side of the image sensor 960 is a side opposite the second side of the image sensor 960. In some embodiments, the leads (not visible) provide connection between the image sensor 960 and corresponding leads (not visible) in or on the flexible printed circuit 940. In some embodiments, in some embodiments, the assembly 900 includes an overmoulding 920 attached to the lead frame 990 and the flexible printed circuit 940.

In some embodiments, a metallic strip 950 is attached to the overmoulding 920 for electromagnetic shielding of the image sensor 960. In some embodiments, the electromagnetic strip 950 is embedded in the overmoulding 920.

Figure 10:
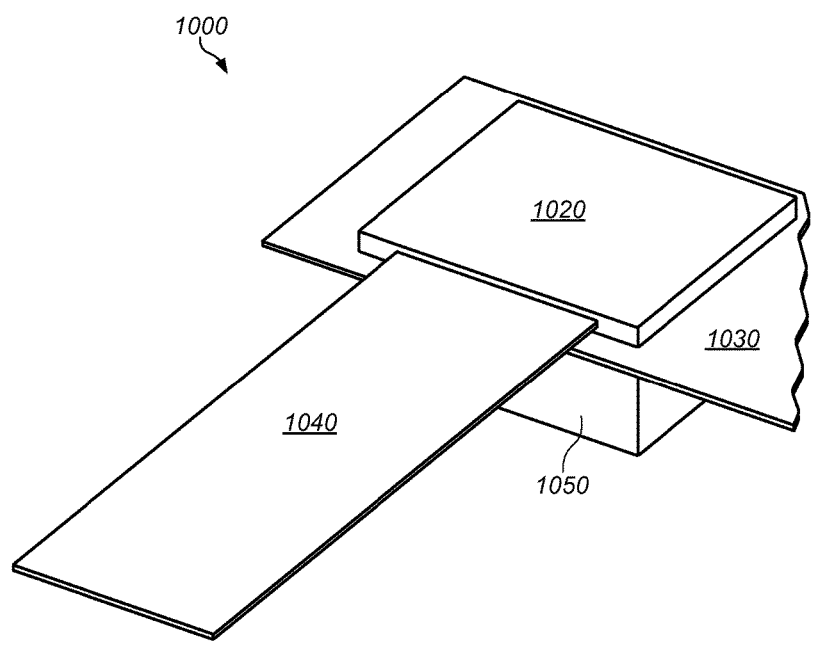
FIG. 10 depicts an assembly resulting from articulation of an overmoulding to a flexible printed circuit, a lead frame apparatus, and an image sensor that may, for example, be used in small form factor cameras, according to at least some embodiments.

FIG. 10 depicts an assembly resulting from articulation of an overmoulding to a flexible printed circuit, a lead frame apparatus, and an image sensor that may, for example, be used in small form factor cameras, according to at least some embodiments. As shown in FIG. 10, the camera assembly 1000 includes an image sensor (not visible) and a flexible printed circuit 1040 with a first side affixed to a first side of the image sensor 1060. In some embodiments, a plurality of metallic leads (not visible) are attached to a lead frame 1030 and affix to a second side of the image sensor (not visible). In some embodiments, the first side of the image sensor (not visible) is a side opposite the second side of the image sensor (not visible). In some embodiments, the leads (not visible) provide connection between the image sensor (not visible) and corresponding leads (not visible) in or on the flexible printed circuit 1040. In some embodiments, the assembly includes an overmoulding 1020 attached to the lead frame 1030 and the flexible printed circuit 1040.

In some embodiments, a metallic strip 1050 is attached to the overmoulding 1020 for electromagnetic shielding of the image sensor (not visible). In some embodiments, the electromagnetic strip 1050 is embedded in the overmoulding 1020.

Figure 11:
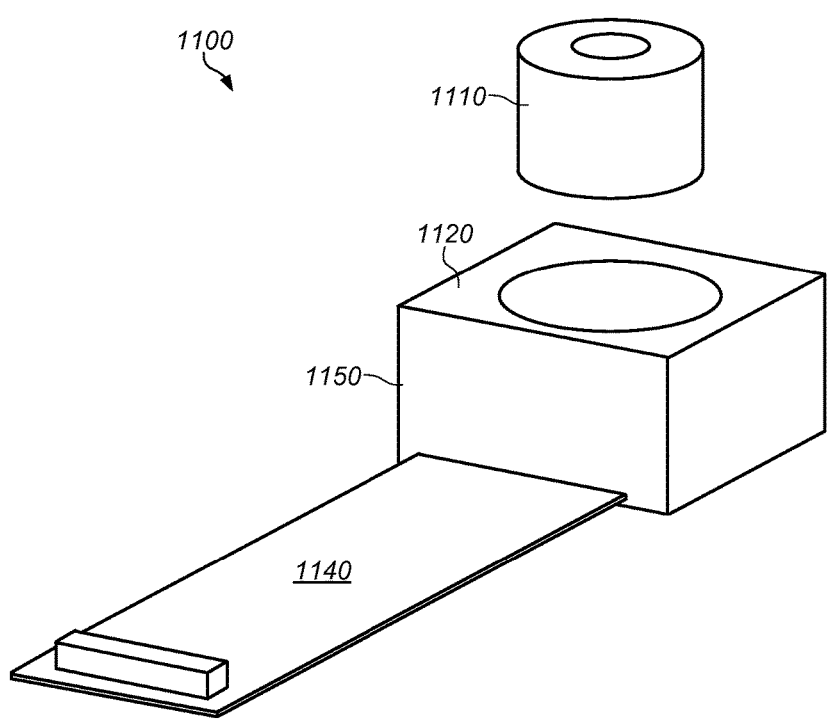
FIG. 11 illustrates articulation of a lens assembly to an assembly resulting from articulation of an overmoulding to a flexible printed circuit, a lead frame apparatus, and an image sensor that may, for example, be used in small form factor cameras, according to at least some embodiments.

FIG. 11 illustrates articulation of a lens assembly to an assembly resulting from articulation of an overmoulding to a flexible printed circuit, a lead frame apparatus, and an image sensor that may, for example, be used in small form factor cameras, according to at least some embodiments. A lens module 1110 is articulated to an overmoulding 1120 of an assembly 1100 including a flexible printed circuit 1140 and a metallic shielding strip.

In some embodiments, the lens assembly 1110 includes a fixed focus lens holder for maintaining a fixed position of a lens of the lens assembly 1110 relative to the image sensor (not visible).

Figure 12:
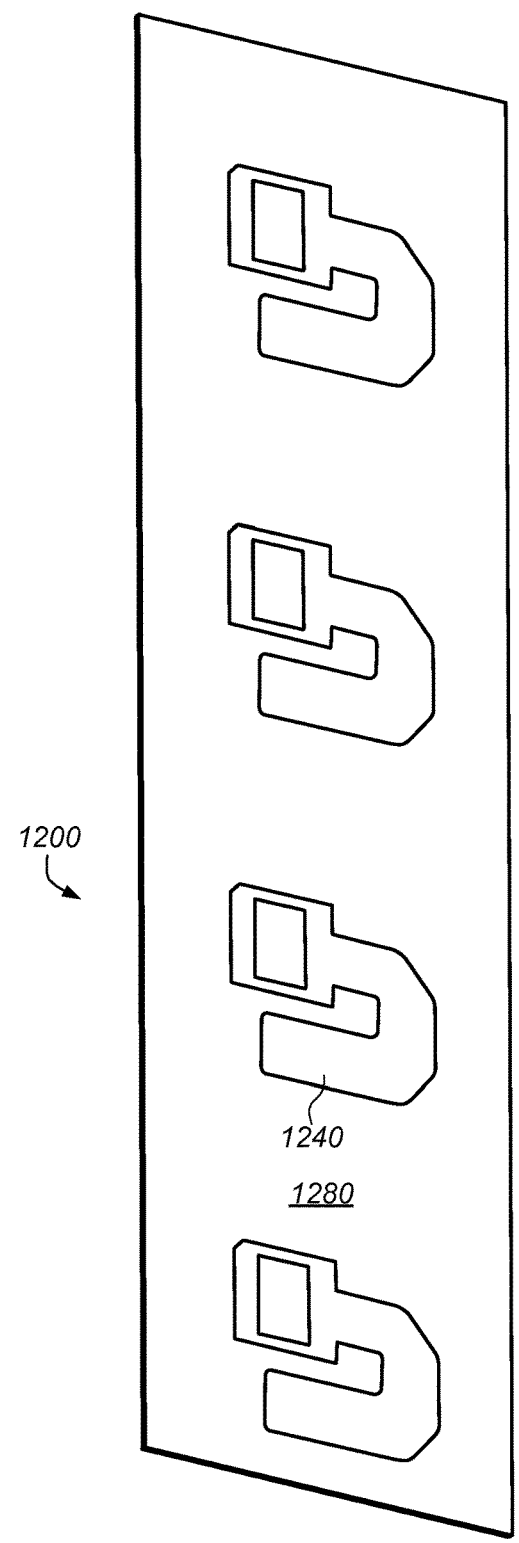
FIG. 12 depicts articulation of a flexible printed circuit to a metallic stiffener that may, for example, be used in small form factor cameras, according to at least some embodiments.

FIG. 12 depicts articulation of a flexible printed circuit to a metallic stiffener that may, for example, be used in small form factor cameras, according to at least some embodiments. A flexible printed circuit 1240 is placed atop a metallic stiffener 1280.

Figure 13:
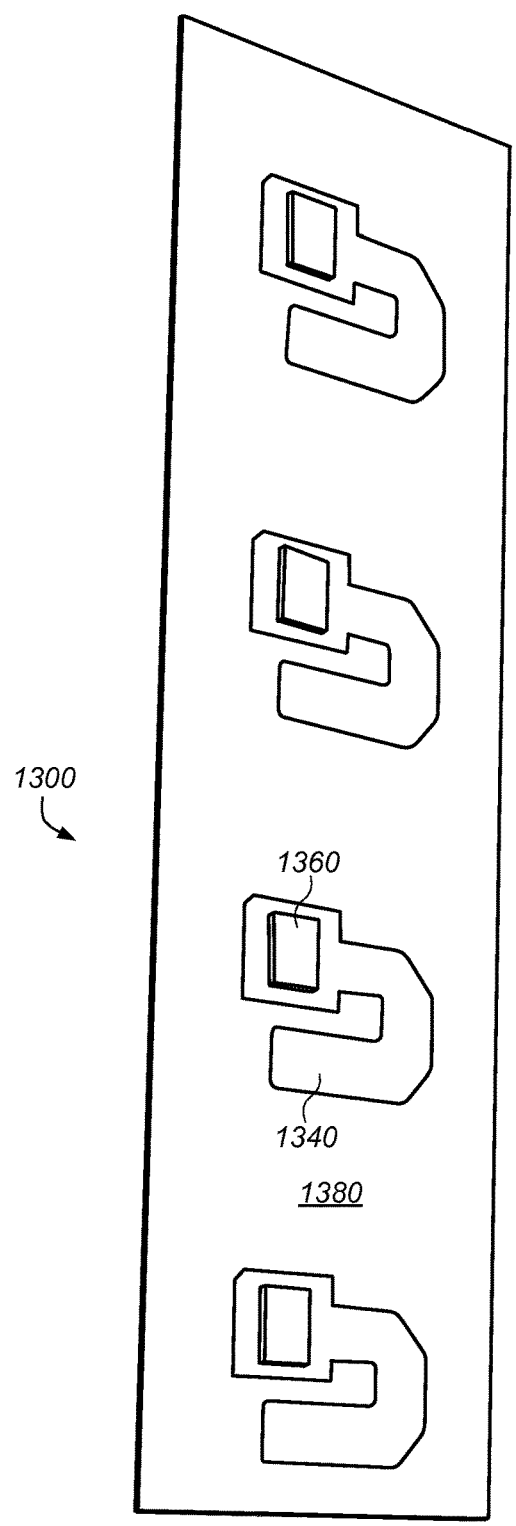
FIG. 13 illustrates articulation of a flexible printed circuit to a lead frame apparatus, a metallic stiffener, and an image sensor that may, for example, be used in small form factor cameras, according to at least some embodiments.

FIG. 13 illustrates articulation of a flexible printed circuit to a lead frame apparatus, a metallic stiffener, and an image sensor that may, for example, be used in small form factor cameras, according to at least some embodiments. An image sensor 1360 is placed atop the flexible printed circuit 1340 and the metallic stiffener 1380. In some embodiments, a lead frame is also placed in the assemblage (not visible).

Figure 14:
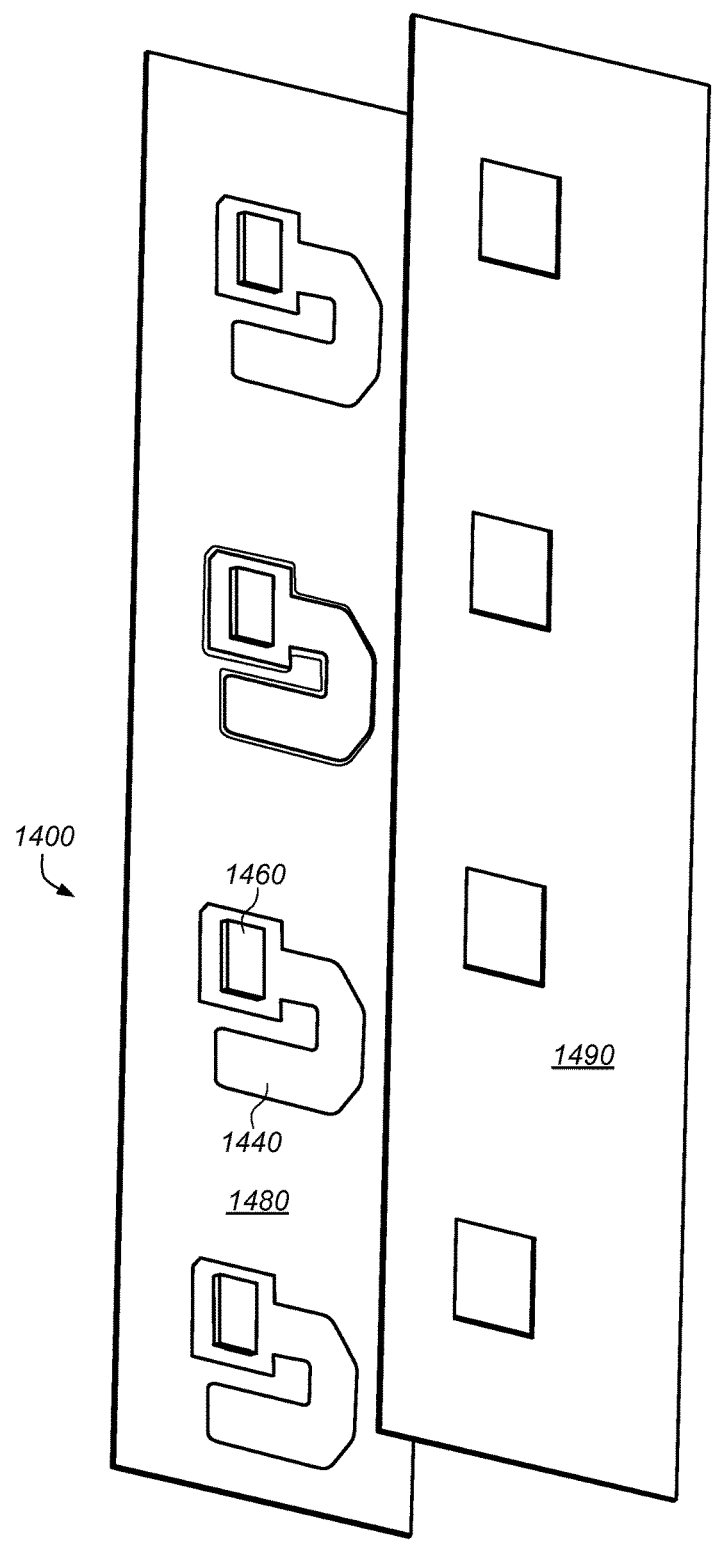
FIG. 14 illustrates articulation of a carrier frame to a flexible printed circuit, a lead frame apparatus, a metallic stiffener, and an image sensor that may, for example, be used in small form factor cameras, according to at least some embodiments.

FIG. 14 illustrates articulation of a carrier frame to a flexible printed circuit, a lead frame apparatus, a metallic stiffener, and an image sensor that may, for example, be used in small form factor cameras, according to at least some embodiments. A copper cover, also called a carrier frame 1490, is placed atop the flexible printed circuit 1440 and the metallic stiffener 1480 without obscuring the image sensor 1460.

Figure 15:
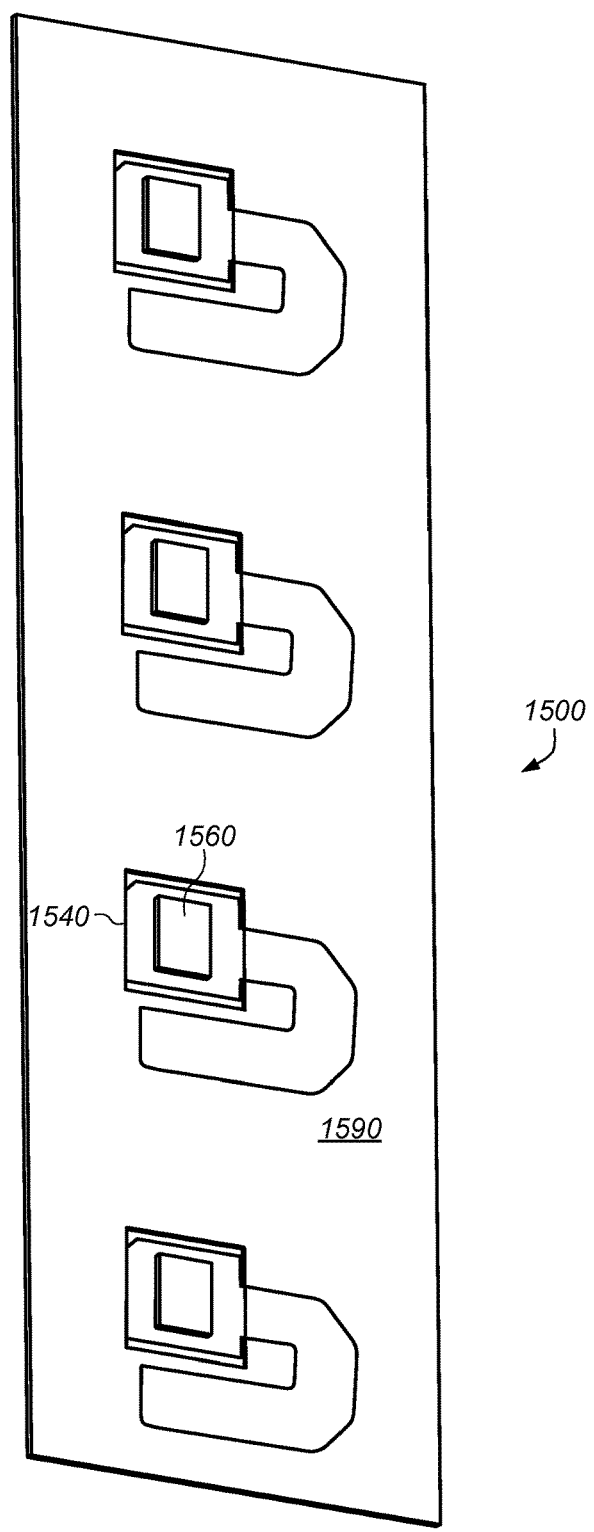
FIG. 15 depicts a result of the articulation of a carrier frame to a flexible printed circuit, a lead frame apparatus, a metallic stiffener, and an image sensor that may, for example, be used in small form factor cameras, according to at least some embodiments.

FIG. 15 depicts a result of the articulation of a carrier frame to a flexible printed circuit, a lead frame apparatus, a metallic stiffener, and an image sensor that may, for example, be used in small form factor cameras, according to at least some embodiments. A copper cover, also called a carrier frame 1590, is visible atop the flexible printed circuit 1540 and the metallic stiffener (not visible) without obscuring the image sensor 1560.

Figure 16:
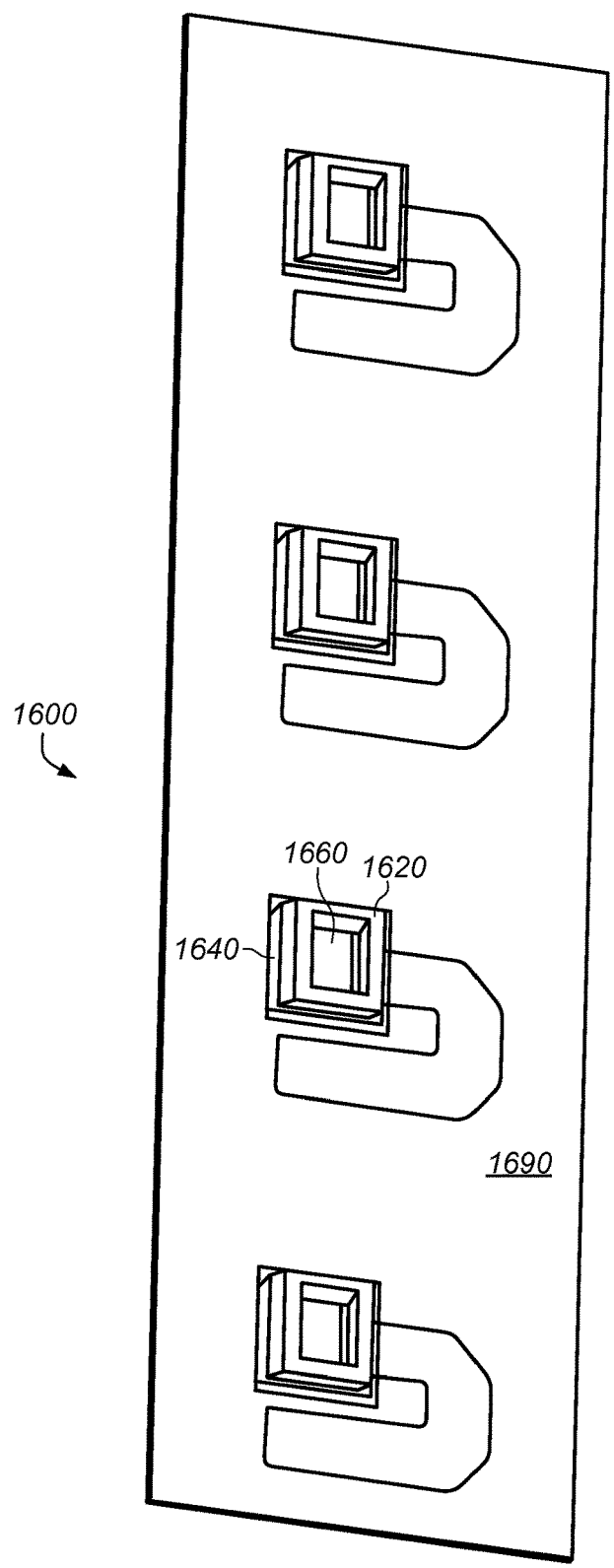
FIG. 16 illustrates articulation of an overmoulding to a result of the articulation of a carrier frame to a flexible printed circuit, a lead frame apparatus, a metallic stiffener, and an image sensor that may, for example, be used in small form factor cameras, according to at least some embodiments.

FIG. 16 illustrates articulation of an overmoulding to a result of the articulation of a carrier frame to a flexible printed circuit, a lead frame apparatus, a metallic stiffener, and an image sensor that may, for example, be used in small form factor cameras, according to at least some embodiments. An overmoulding 1620 is placed atop the flexible printed circuit 1640 and the metallic stiffener (not visible) without obscuring the image sensor 1660. The carrier frame 1690 remains uncut.

Figure 17:
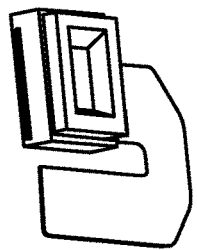
FIG. 17 depicts a result of removal of surplus metal from an articulation of an overmoulding to a result of the articulation of a carrier frame to a flexible printed circuit, a lead frame apparatus, a metallic stiffener, and an image sensor that may, for example, be used in small form factor cameras, according to at least some embodiments.
Figure 17:
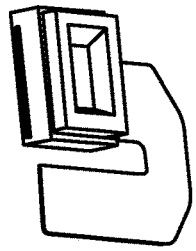
Figure 17:
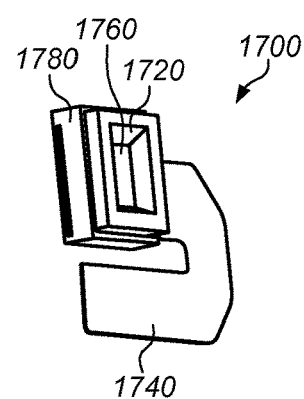
Figure 17:
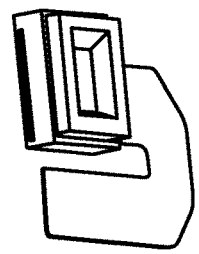

FIG. 17 depicts a result of removal of surplus metal from an articulation of an overmoulding to a result of the articulation of a carrier frame to a flexible printed circuit, a lead frame apparatus, a metallic stiffener, and an image sensor that may, for example, be used in small form factor cameras, according to at least some embodiments. Excess metal is removed from the articulation of the overmoulding 1720 atop the flexible printed circuit 1740, and the metallic stiffener 1780 is folded to create attachment ledges (and in some embodiments epoxied) for securing the overmoulding, protecting the image sensor 1660. The flexible printed circuit 1740 is also freed from excess carrier frame material.

Figure 18:
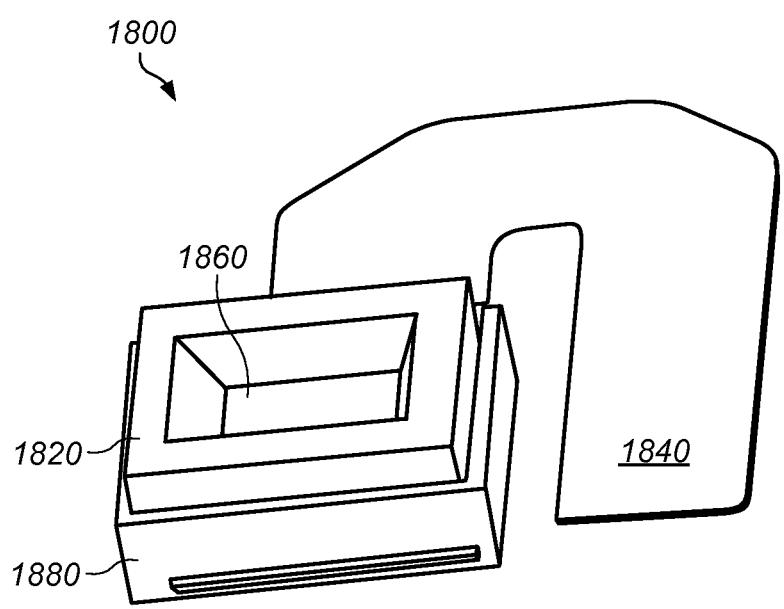
FIG. 18 illustrates a result of removal of surplus metal from an articulation of an overmoulding to a result of the articulation of a carrier frame to a flexible printed circuit, a lead frame apparatus, a metallic stiffener, and an image sensor that may, for example, be used in small form factor cameras, according to at least some embodiments.

FIG. 18 illustrates a result of removal of surplus metal from an articulation of an overmoulding to a result of the articulation of a carrier frame to a flexible printed circuit, a lead frame apparatus, a metallic stiffener, and an image sensor that may, for example, be used in small form factor cameras, according to at least some embodiments. A camera module 1800 includes an image sensor 1860, a flexible printed circuit with a first side affixed to a first side of the image sensor (beneath metallic cover 1840), a metallic stiffener affixed to a second side of the flexible printed circuit (not visible). In some embodiments, the second side of the flexible printed circuit is opposite a first side of the flexible printed circuit. In some embodiments, the metallic stiffener includes one or more ledges (1880) folded to enclose the overmoulding on one or more sides. In some embodiments, the metallic stiffener comprises one or more ledges epoxied to the overmoulding on one or more sides.

Additional Example Camera Hardware

Figure 19:
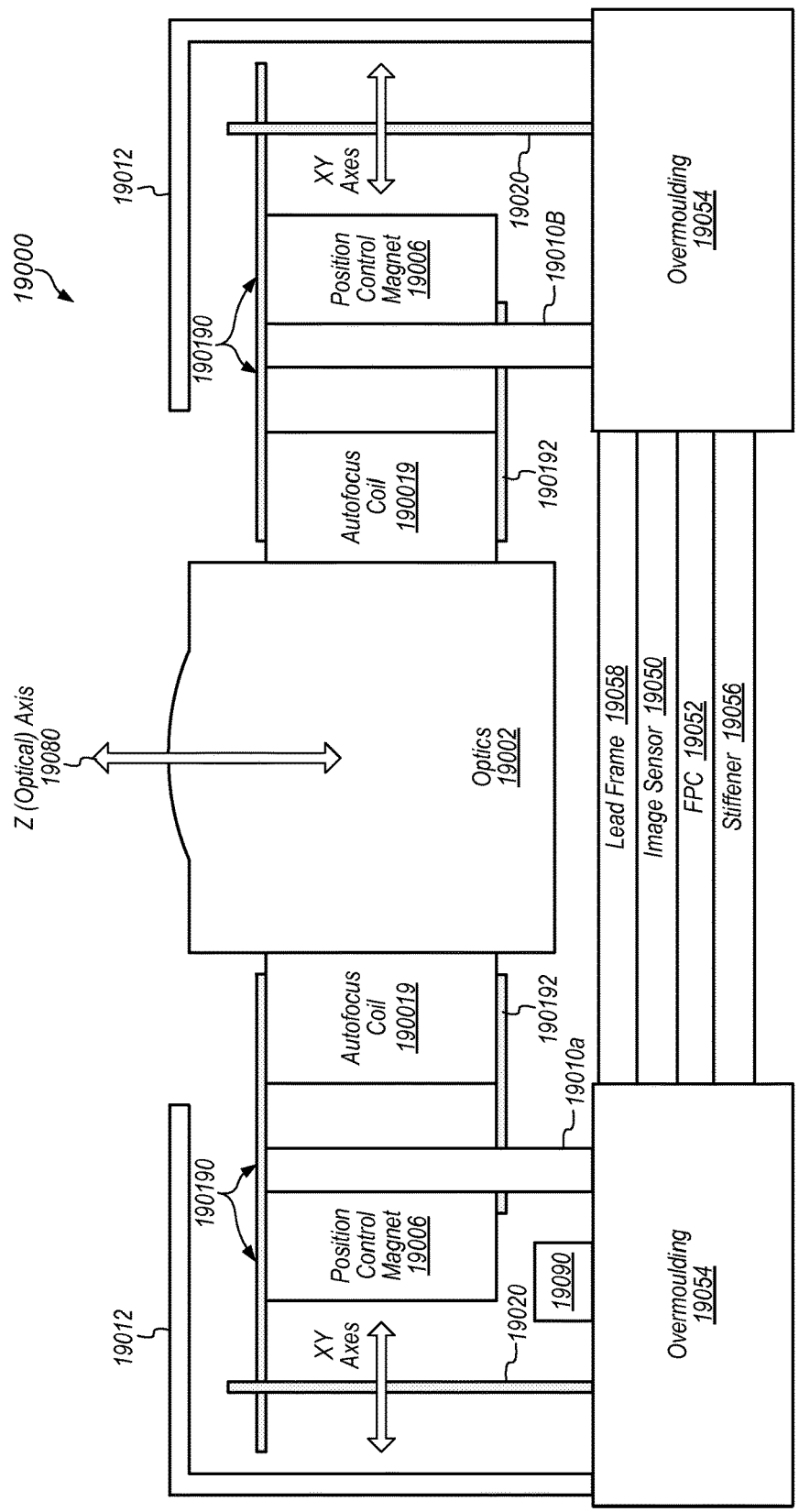
FIG. 19 depicts an example of a camera module articulated to an articulation of an overmoulding to a result of the articulation of a carrier frame to a flexible printed circuit, a lead frame apparatus, a metallic stiffener, and an image sensor that may, for example, be used in small form factor cameras, according to at least some embodiments.

FIG. 19 depicts a side view of an example embodiment of an actuator module or assembly that may, for example, be used to provide a moveable lens package suitable for use with at least some embodiments.

In addition to use with fixed-position lenses, some embodiments may be applied within a camera, actuator package or image sensor assembly 19000 interacting with an image sensor 19050 as illustrated in FIG. 19 to stabilize and increase control performance of an optics assembly 19002 suspended on wires 19020 within an actuator package 19000a-c as shown in FIG. 19.

In some embodiments, each position control magnet 19006 is poled so as to generate a magnetic field, the useful component of which for the autofocus function is orthogonal to the optical axis of the camera/lens, and orthogonal to the plane of each magnet 19006 proximate to the autofocus coil 19004, and where the field for all four magnets 19006 are all either directed towards the autofocus coil 19004, or away from it, so that the Lorentz forces from all four magnets 19006 act in the same direction along the optical axis 19080.

As shown in FIG. 19, an actuator package 19000 may include a base assembly or substrate 19008, an optics assembly 19002, and a cover 19012. Base assembly 19008 may include one or more of, but is not limited to, a base 19008, supporting one or more position sensors (e.g., capacitor plates) 19010a-b, and suspension wires 19020.

In at least some embodiments, there are four suspension wires 19020. An optics assembly 19002 may be suspended on the base assembly 19008 by suspension of the upper springs 19040 of optics assembly 19000 on the suspension wires 19020. Actuator module 19000 may include one or more of, but is not limited to, optics 19002, optics holder (autofocus coil) 19004, magnet(s) 19006, upper spring(s) 19040, and lower spring(s) 19042. The upper and lower spring(s) may be collectively referred to herein as optics springs. In optics assembly 19000, an optics component 19002 (e.g., a lens or lens assembly) may be screwed, mounted or otherwise held in or by an optics holder (autofocus coil) 19004. In at least some embodiments, the optics 19002/optics holder (autofocus coil) 19004 assembly may be suspended from or attached to the position control magnets 19006 by upper spring(s) 19040, and lower spring(s) 19042, and the position control magnets 19006 may be rigidly mounted to base 19008. Note that upper spring(s) 19040 and lower spring(s) 19042 are flexible to allow the optics assembly 19000 a range of motion along the Z (optical) axis for optical focusing, wires 19020 are flexible to allow a range of motion on the XY plane orthogonal to the optical axis for optical image stabilization.

Note that, in some embodiments, an optics assembly 19000 or an actuator module may not include position control magnets 19006, but may include a yoke or other structure 19006 that may be used to help support the optics assembly on suspension wires 19020 via upper springs 190190. However in some embodiments, optics assembly 19000 may not include elements 19006. In general, other embodiments of an optics assembly 19000 may include fewer or more components than the example optics assembly 19000 shown in FIG. 19. Also note that, while embodiments show the optics assembly 19000 suspended on wires 19020, other mechanisms may be used to suspend an optics assembly 19000 in other embodiments.

The autofocus yoke (e.g., magnets or holder(s) 19006) acts as the support chassis structure for the autofocus mechanism of actuator 19000. The lens carrier (optics holder 19004) is suspended on the autofocus yoke by an upper autofocus (AF) spring 19040 and a lower optics spring 19042. In this way when an electric current is applied to the autofocus coil, Lorentz forces are developed due to the presence of the four magnets, and a force substantially parallel to the optical axis is generated to move the lens carrier, and hence lens, along the optical axis, relative to the support structure of the autofocus mechanism of the actuator, so as to focus the lens. In addition to suspending the lens carrier and substantially eliminating parasitic motions, the upper spring 19040 and lower spring 4042 also resist the Lorentz forces, and hence convert the forces to a displacement of the lens. This basic architecture shown in FIG. 19 and is typical of some embodiments, in which optical image stabilization function includes moving the entire autofocus mechanism of the actuator (supported by the autofocus yoke) in linear directions orthogonal to the optical axis, in response to user handshake, as detected by some means, such a two or three axis gyroscope, which senses angular velocity. The handshake of interest is the changing angular tilt of the camera in 'pitch and yaw directions', which can be compensated by said linear movements of the lens relative to the image sensor.

At least some embodiments may achieve this two independent degree-of-freedom motion by using two pairs of optical image stabilization coils, each pair acting together to deliver controlled motion in one linear axis orthogonal to the optical axis, and each pair delivering controlled motion in a direction substantially orthogonal to the other pair. In at least some embodiments, these optical image stabilization coils may be fixed to the camera actuator support structure, and when current is appropriately applied, optical image stabilization coils may generate Lorentz forces on the entire autofocus mechanism of the actuator, moving it as desired. The required magnetic fields for the Lorentz forces are produced by the same four magnets that enable to the Lorentz forces for the autofocus function. However, since the directions of motion of the optical image stabilization movements are orthogonal to the autofocus movements, it is the fringing field of the four magnets that are employed, which have components of magnetic field in directions parallel to the optical axis.

Returning to FIG. 19, in at least some embodiments, the suspension of the autofocus mechanism on the actuator 19000 support structure may be achieved by the use of four corner wires 19020, for example wires with a circular cross-section. Each wire 19020 acts as a flexure beams capable of bending with relatively low stiffness, thus allowing motion in both optical image stabilization degrees-of-freedom. However, wire 19020 is in some embodiments relatively stiff in directions parallel to the optical axis, as this would require the wire to stretch or buckle, thus substantially preventing parasitic motions in these directions. In addition, the presence of four such wires, appropriately separated allows them to be stiff in the parasitic tilt directions of pitch and yaw, thus substantially preventing relative dynamic tilt between the lens and image sensor. This may be seen by appreciating that each wire 19020 is stiff in directions that require it to change in length, and hence the fixed points at the ends of each wire (eight points in total) will substantially form the vertices of a parallelepiped for all operational positions of the optical image stabilization mechanism.

In some embodiments, a package of processors and memory 19090 or other computer-readable medium as described herein may alternatively, in some embodiments, be omitted from actuator module 19000 and housed elsewhere in a device in which actuator package 19000 is installed.

In some embodiments, actuator package 19000 is installed in a camera of a mobile computing device.

Some embodiments include an image sensor structure 19050 mounted to an overmoulding 19054, flexible printed circuit, lead frame 19058 and stiffener 19056, as described herein.

Example Manufacturing Processes

Figure 20:
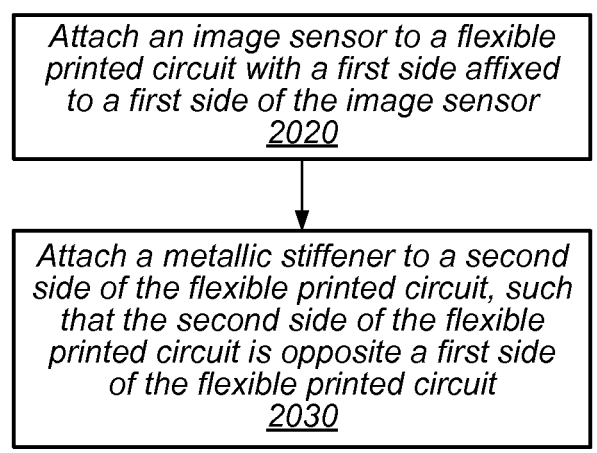
FIG. 20 is a flowchart of a method for manufacturing a camera assembly, according to at least some embodiments.

FIG. 20 is a flowchart of a method for manufacturing a camera assembly, according to at least some embodiments. An image sensor is attached to a flexible printed circuit with a first side affixed to a first side of the image sensor (block 2020). A metallic stiffener is attached to a second side of the flexible printed circuit, such that the second side of the flexible printed circuit is opposite a first side of the flexible printed circuit (block 2030).

Figure 21:
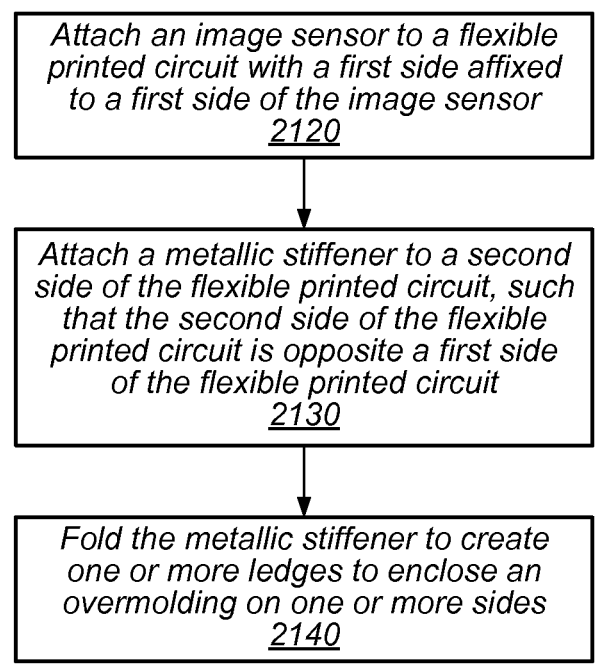
FIG. 21 is a flowchart of a method for manufacturing a camera assembly, according to at least some embodiments.

FIG. 21 is a flowchart of a method for manufacturing a camera assembly, according to at least some embodiments. An image sensor is attached to a flexible printed circuit with a first side affixed to a first side of the image sensor (block 2120). A metallic stiffener is attached to a second side of the flexible printed circuit, such that the second side of the flexible printed circuit is opposite a first side of the flexible printed circuit (block 2130). The metallic stiffener is folded to create one or more ledges to enclose the overmolding on one or more sides (block 2140).

Figure 22:
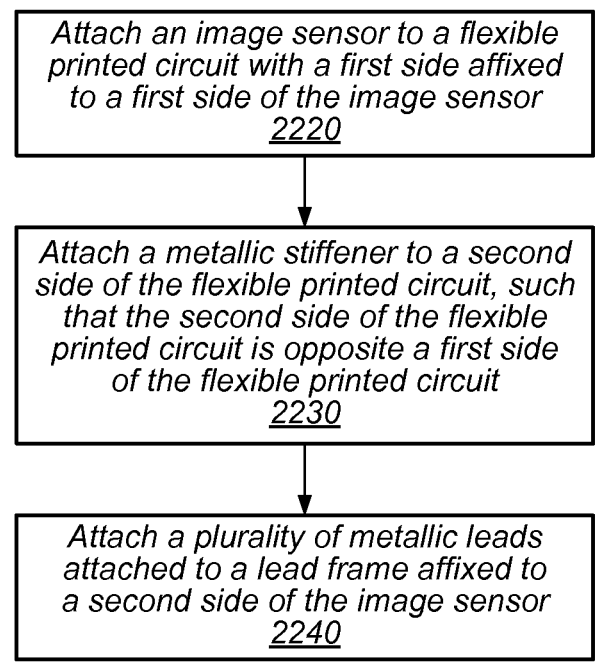
FIG. 22 is a flowchart of a method for manufacturing a camera assembly, according to at least some embodiments.

FIG. 22 is a flowchart of a method for manufacturing a camera assembly, according to at least some embodiments. An image sensor is attached to a flexible printed circuit with a first side affixed to a first side of the image sensor (block 2120). A metallic stiffener is attached to a second side of the flexible printed circuit, such that the second side of the flexible printed circuit is opposite a first side of the flexible printed circuit (block 2130). A plurality of metallic leads is affixed to a second side of the image sensor (block 2240).

Example Computer System

Figure 23:
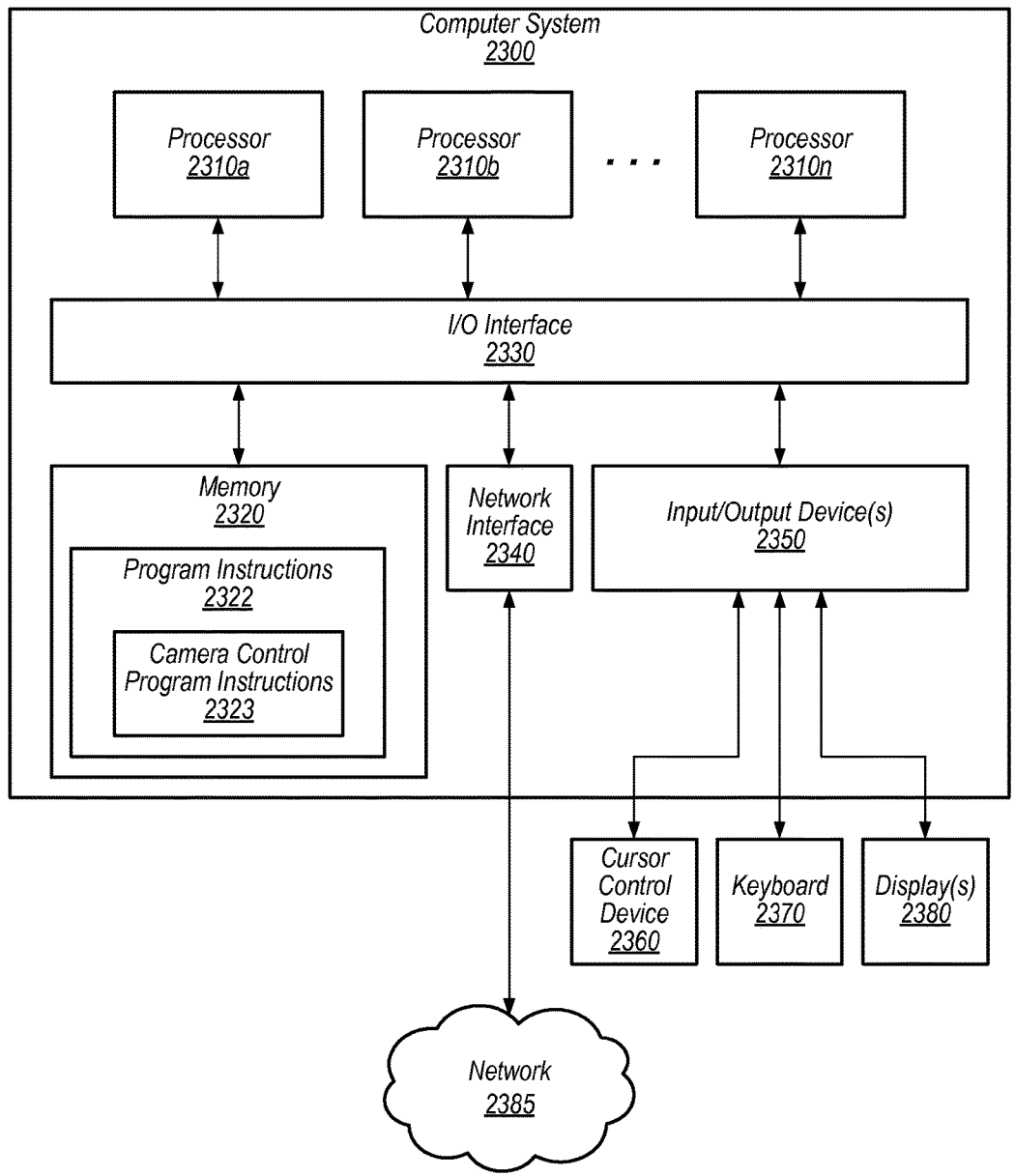
FIG. 23 illustrates an example computer system configured to implement aspects of the methods and systems described herein, according to some embodiments.

FIG. 23 illustrates an example computer system 2300 that may be configured to execute any or all of the embodiments described above. In different embodiments, computer system 2300 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, or of manufacturing processes for camera modules and components, as described herein may be executed in one or more computer systems 2300, which may interact with various other devices. Note that any component, action, or functionality described above with respect to FIGS. 1-10 may be implemented on one or more computers configured as computer system 2300 of FIG. 23, according to various embodiments. In the illustrated embodiment, computer system 2300 includes one or more processors 2310 coupled to a system memory 2320 via an input/output (I/O) interface 2330. Computer system 2300 further includes a network interface 2340 coupled to I/O interface 2330, and one or more input/output devices 2350, such as cursor control device 2360, keyboard 2370, and display(s) 2380. In some cases, it is contemplated that embodiments may be implemented using a single instance of computer system 2300, while in other embodiments multiple such systems, or multiple nodes making up computer system 2300, may be configured to host different portions or instances of embodiments. For example, in one embodiment some elements may be implemented via one or more nodes of computer system 2300 that are distinct from those nodes implementing other elements.

In various embodiments, computer system 2300 may be a uniprocessor system including one processor 2310, or a multiprocessor system including several processors 2310 (e.g., two, four, eight, or another suitable number). Processors 2310 may be any suitable processor capable of executing instructions. For example, in various embodiments processors 2310 may be general-purpose or embedded processors implementing any of a variety of instruction set architectures (ISAs), such as the x86, PowerPC, SPARC, or MIPS ISAs, or any other suitable ISA. In multiprocessor systems, each of processors 2310 may commonly, but not necessarily, implement the same ISA.

System memory 2320 may be configured to store camera control program instructions 2322 and/or camera control data accessible by processor 2310. In various embodiments, system memory 2320 may be implemented using any suitable memory technology, such as static random access memory (SRAM), synchronous dynamic RAM (SDRAM), nonvolatile/Flash-type memory, or any other type of memory. In the illustrated embodiment, program instructions 2322 may be configured to implement a lens control application 2324 incorporating any of the functionality described above. Additionally, existing camera control data 2332 of memory 2320 may include any of the information or data structures described above. In some embodiments, program instructions and/or data may be received, sent or stored upon different types of computer-accessible media or on similar media separate from system memory 2320 or computer system 2300. While computer system 2300 is described as implementing the functionality of functional blocks of previous Figures, any of the functionality described herein may be implemented via such a computer system.

In one embodiment, I/O interface 2330 may be configured to coordinate I/O traffic between processor 2310, system memory 2320, and any peripheral devices in the device, including network interface 2340 or other peripheral interfaces, such as input/output devices 2350. In some embodiments, I/O interface 2330 may perform any necessary protocol, timing or other data transformations to convert data signals from one component (e.g., system memory 2320) into a format suitable for use by another component (e.g., processor 2310). In some embodiments, I/O interface 2330 may include support for devices attached through various types of peripheral buses, such as a variant of the Peripheral Component Interconnect (PCI) bus standard or the Universal Serial Bus (USB) standard, for example. In some embodiments, the function of I/O interface 2330 may be split into two or more separate components, such as a north bridge and a south bridge, for example. Also, in some embodiments some or all of the functionality of I/O interface 2330, such as an interface to system memory 2320, may be incorporated directly into processor 2310.

Network interface 2340 may be configured to allow data to be exchanged between computer system 2300 and other devices attached to a network 2385 (e.g., carrier or agent devices) or between nodes of computer system 2300. Network 2385 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 2340 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 2350 may, in some embodiments, include one or more display terminals, keyboards, keypads, touchpads, scanning devices, voice or optical recognition devices, or any other devices suitable for entering or accessing data by one or more computer systems 2300. Multiple input/output devices 2350 may be present in computer system 2300 or may be distributed on various nodes of computer system 2300. In some embodiments, similar input/output devices may be separate from computer system 2300 and may interact with one or more nodes of computer system 2300 through a wired or wireless connection, such as over network interface 2340.

As shown in FIG. 23, memory 2320 may include program instructions 2322, which may be processor-executable to implement any element or action described above. In one embodiment, the program instructions may implement the methods described above. In other embodiments, different elements and data may be included. Note that data may include any data or information described above.

Those skilled in the art will appreciate that computer system 2300 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 2300 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 2300 may be transmitted to computer system 2300 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera module comprising:
an image sensor;
a flexible printed circuit with a first side directly affixed to a first side of the image sensor;
a lead frame comprising metallic leads affixed to a second side of the image sensor, wherein
the first side of the image sensor is a side opposite the second side of the image sensor, and
the metallic leads provide connection between the image sensor and corresponding leads in the flexible printed circuit; and
a lens assembly for directing light to the image sensor, wherein the lens assembly is coupled to the image sensor by an overmoulding that is in contact with the metallic leads of the lead frame.

2. The camera module of claim 1, further comprising:
a metallic strip for electromagnetic shielding of the image sensor, wherein the electromagnetic strip is embedded in the overmoulding.

3. The camera module of claim 1, wherein
the camera module further comprises a camera actuator motor articulated to the overmoulding for adjusting a position of a lens of the lens assembly relative to the image sensor.

4. The camera module of claim 1, wherein
the lens assembly comprises a fixed focus lens holder for maintaining a fixed position of a lens of the lens assembly relative to the image sensor.

5. The camera module of claim 1, further comprising:
a metallic stiffener affixed to a second side of the flexible printed circuit, wherein
the second side of the flexible printed circuit is opposite a first side of the flexible printed circuit,
the metallic stiffener comprises one or more ledges folded to enclose the overmoulding on one or more sides.

6. The camera module of claim 1, further comprising:
a metallic stiffener affixed to a second side of the flexible printed circuit, wherein
the second side of the flexible printed circuit is opposite a first side of the flexible printed circuit.

7. The camera module of claim 1, wherein
the camera module further comprises a voice coil motor articulated to the overmoulding for adjusting a position of a lens of the lens assembly relative to the image sensor.

8. An image sensor assembly comprising:
an image sensor;
a flexible printed circuit with a first side directly affixed to a first side of the image sensor; and
a metallic stiffener affixed to a second side of the flexible printed circuit, wherein:
the second side of the flexible printed circuit is opposite the first side of the flexible printed circuit, and
the metallic stiffener comprises one or more ledges folded to at least partially enclose one or more sides of an overmoulding.

9. The image sensor assembly of claim 8, wherein
the one or more ledges are epoxied to the one or more sides of the overmoulding.

10. The image sensor assembly of claim 8, further comprising:
metallic leads affixed to a second side of the image sensor, wherein
the metallic leads provide connection between the image sensor and leads in the flexible printed circuit.

11. The image sensor assembly of claim 8, further comprising:
a plurality of metallic leads affixed to a second side of the image sensor, wherein
the plurality of metallic leads provides a wire bond connection from the flexible printed circuit to the image sensor.

12. The image sensor assembly of claim 8, further comprising:
a plurality of metallic leads affixed to a second side of the image sensor, wherein
the plurality of metallic leads provides a connection from the flexible printed circuit to the image sensor through a pillar bump comprising a copper alloy.

13. The image sensor assembly of claim 8, further comprising:
metallic leads affixed to a second side of the image sensor, wherein
the first side of the image sensor is a side opposite the second side of the image sensor, and
the metallic leads provide connection between the image sensor and leads in the flexible printed circuit.

14. A method for assembling an image sensor assembly, the method comprising:
attaching an image sensor to a flexible printed circuit such that a first side of the flexible printed circuit is directly affixed to a first side of the image sensor;
affixing a metallic stiffener to a second side of the flexible printed circuit, wherein the second side of the flexible printed circuit is opposite the first side of the flexible printed circuit, and
folding the metallic stiffener to create one or more ledges to at least partially enclose one or more sides of an overmoulding.

15. The method of claim 14, further comprising
dispensing epoxy onto the metallic stiffener to secure the one or more ledges to the one or more sides of the overmoulding.

16. The method of claim 14, further comprising
attaching a plurality of metallic leads to a second side of the image sensor, wherein
the leads provide connection between the image sensor and leads in the flexible printed circuit.

17. The method of claim 14, further comprising
attaching a plurality of metallic leads to a second side of the image sensor, wherein
the plurality of metallic leads provides a wire bond connection from the flexible printed circuit to the image sensor.

18. The method of claim 14, further comprising
attaching a plurality of metallic leads to a second side of the image sensor, wherein the plurality of metallic leads provides a connection from the flexible printed circuit to the image sensor through a pillar bump comprising a copper alloy.

19. The camera module of claim 1, wherein the overmoulding is further attached to the flexible printed circuit.

20. The image sensor assembly of claim 8, further comprising
a metallic strip for electromagnetic shielding of the image sensor, wherein
the electromagnetic strip is embedded in the overmoulding.

* * * * *